US008329528B2

United States Patent
Shima

(10) Patent No.: US 8,329,528 B2
(45) Date of Patent: Dec. 11, 2012

(54) SEMICONDUCTOR DEVICE AND METHOD OF MANUFACTURING SEMICONDUCTOR DEVICE

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/397,885

(22) Filed: Feb. 16, 2012

(65) Prior Publication Data

US 2012/0149188 A1    Jun. 14, 2012

Related U.S. Application Data

(60) Division of application No. 12/548,098, filed on Aug. 26, 2009, now Pat. No. 8,143,675, which is a continuation of application No. PCT/JP2007/055555, filed on Mar. 19, 2007.

(51) Int. Cl.
*H01L 21/8238* (2006.01)
(52) U.S. Cl. ...................................... 438/199; 438/761
(58) Field of Classification Search .................. 438/199, 438/761
See application file for complete search history.

(56) References Cited

U.S. PATENT DOCUMENTS

| | | | |
|---|---|---|---|
| 6,794,256 | B1 | 9/2004 | Fuselier et al. |
| 6,982,465 | B2 * | 1/2006 | Kumagai et al. ............. 257/369 |
| 2003/0040158 | A1 | 2/2003 | Saitoh |
| 2004/0075148 | A1 | 4/2004 | Kumagai et al. |
| 2006/0006420 | A1 | 1/2006 | Goto |

FOREIGN PATENT DOCUMENTS

| | | |
|---|---|---|
| CN | 1830074 A | 9/2006 |
| JP | 2003-060076 A | 2/2003 |
| JP | 2003-086708 A | 3/2003 |
| JP | 2004-193166 A | 7/2004 |
| JP | 2006-060175 A | 3/2006 |
| JP | 2007-501518 A | 1/2007 |
| KR | 10-2006-0004595 A | 1/2006 |

OTHER PUBLICATIONS

S.E. Thompson, et al. "A 90-nm Logic Technology Featuring Strained-silicon," IEEE Transactions on Electron Devices, vol. 51, No. 11, Nov. 2004. pp. 1790-1797.
C. H. Ge et al., "Process-strained-Si (PSS) CMOS Technology Featuring 3D Strain Engineering," IEDM Technology Digest 2003, pp. 73-76.
C.S. Smith, et al. "Piezoresistance Effect in Germanium and Silicon," Physics Review, vol. 94, No. 1, 1954, pp. 42-49.
International Search Report of PCT/JP2007/055555, Mailing Date of Jun. 26, 2007.

(Continued)

*Primary Examiner* — Zandra Smith
*Assistant Examiner* — Paul Patton
(74) *Attorney, Agent, or Firm* — Westerman, Hattori, Daniels & Adrian, LLP

(57) ABSTRACT

The semiconductor device includes an n-channel transistor including n-type source/drain regions and a first gate electrode, a first sidewall insulating film formed on a side wall of the first gate electrode and having a Young's modulus smaller than a Young's modulus of silicon, a p-channel transistor including p-type source/drain regions and a second gate electrode, a second sidewall insulating film formed on a side wall of the second gate electrode and having a Young's modulus larger than the Young's modulus of silicon, a tensile stressor film formed, covering the n-channel transistor, and a compressive stressor film formed, covering the p-channel transistor.

8 Claims, 24 Drawing Sheets

OTHER PUBLICATIONS

Chineses Office Action dated Jan. 12, 2011, issuesd in corresponding Chineses Patent Application No. 200780052224.5.
Korean Office Action dated Mar. 29, 2011, issued in corresponding Korean Patent Application No. 10-2009-7016444.

Japanese Office Action dated Aug. 21, 2012, issued in corresponding Japanese Patent Application No. 2009-504992 (6 pages, with English Translation).

* cited by examiner

FIG. 2

TYPE OF STRESS NEEDED FOR ENHANCED MOBILITY

| DIRECTION | NMOS | PMOS |
|---|---|---|
| LONGITUDINAL | TENSION +++ | COMPRESSION ++++ |
| TRANSVERSE | TENSION ++ | TENSION +++ |
| OUT-OF-PLANE | COMPRESSION ++++ | TENSION + |

SEMICONDUCTOR DEVICE AND METHOD OF MANUFACTURING SEMICONDUCTOR DEVICE

CROSS-REFERENCE TO RELATED APPLICATIONS

This application is a Divisional Application of U.S. application Ser. No. 12/548,098, filed Aug. 26, 2009, which is a Continuation of International Application No. PCT/JP2007/055555, with an international filing date of Mar. 19, 2007, which designating the United States of America, the entire contents of which are incorporated herein by reference.

FIELD

The embodiments discussed herein are related to a semiconductor device and a method of manufacturing semiconductor device, more specifically, a semiconductor device including a MIS transistor having a strain introduced in a channel region, and a method of manufacturing the same.

BACKGROUND

So far, the MOS transistor has been integrated more highly by downsizing, whereby high speed and low electric power consumption have been attained. However, the downsizing of the MOS transistor depending on the scaling rule is coming to the limit. Studies of technologies of enhancing the performance of the MOS transistor by means which does not depend on the downsizing are becoming active.

For example, studies of the technology of introducing a strain in the channel region of the MOS transistor to thereby change properties of the channel material so as to improve the carrier mobility are becoming active.

As one example of the technology of introducing the strain in the channel region is known the technology that stresses is applied to the channel region by the etching stopper film for forming the contact holes to thereby introduce the strain in the channel region. As such etching stopper film, a tensile stressor film having a tensile stress is formed over the NMOS transistor. Over the PMOS transistor, a compressive stressor film having a compressive stress is formed.

FIG. 24 is a diagrammatic section view of the conventional semiconductor device of the CMOS structure having strains introduced in the channel regions by the tensile stressor film and the compressive stressor film.

As illustrated, a device isolation film 102 for defining device regions is formed in a surface of a silicon substrate 100. The device region on the left side of the drawing is an NMOS transistor forming region, and the device region on the right side of the drawing is a PMOS transistor forming region.

Over the silicon substrate 100 in the NMOS transistor forming region, a gate electrode 106n is formed with a gate insulating film 104 interposed therebetween. On a side wall of the gate electrode 106n, a sidewall insulating film 108 is formed.

In the silicon substrate 100 on both sides of the gate electrode 106n, n-type source/drain regions 110n having the extension source/drain structure are formed.

On the gate electrode 106n and the n-type source/drain regions 110n, metal silicide films 112 are formed.

Thus, on the silicon substrate 100 in the NMOS transistor forming region, an NMOS transistor 114n including the gate electrode 106n and the n-type source/drain regions 110n is formed.

Over the NMOS transistor 114n, a tensile stressor film 116 having a tensile stress is formed, covering the NMOS transistor 114n. As the tensile stressor film 116, a silicon nitride film having a tensile stress is formed. In the channel region of the NMOS transistor 114n, a strain due to the stress applied by the tensile stressor film 116 is introduced.

Over the silicon substrate 100 in the PMOS transistor forming region, a gate electrode 106p is formed with a gate insulating film 104 interposed therebetween. On a side wall of the gate electrode 106p, a sidewall insulating film 108 is formed.

In the silicon substrate 100 on both sides of the gate electrode 106p, p-type source/drain regions 110p having the extension source/drain structure are formed.

On the gate electrode 106p and the p-type source/drain regions 110p, metal silicide films 112 are formed.

Thus, on the silicon substrate 100 in the PMOS transistor forming region, a PMOS transistor 114p including the gate electrode 106p and the p-type source/drain regions 110p is formed.

Over the PMOS transistor 114P, a compressive stressor film having a compressive stress is formed, covering the PMOS transistor 114p. As the compressive stressor film 118, a silicon nitride film having a compressive stress is formed. In the channel region of the PMOS transistor 114p, a strain due to the stress applied by the compressive stressor film 118 is introduced.

As described above, the CMOS structure of the combination of the NMOS transistor 114 having the strain introduced in the channel region by the tensile stressor film 116, and the PMOS transistor 114p having the strain introduced in the channel region by the tensile stressor film 118 can increase the strains introduced in the channel regions and improve the carrier mobility at low costs by optimizing the respective sectional structures of the NMOS transistor 114n and the PMOS transistor 114p.

The followings are examples of related art of the present invention: S. E. Thompson et al., "A 90-nm logic technology featuring strained-silicon," IEEE Trans. Elec. Dev., Vol. 51, No. 11, pp. 1790-1797, November 2004; C.-H. Ge et al., "Process-strained-Si (PSS) CMOS technology featuring 3D strain engineering," IEDM Tech. Dig., 2003, pp 73-76; and C. S. Smith, "Piezoresistance effect in germanium and silicon," Phys. Rev., vol. 94, No. 1, pp. 42-49, 1954.

However, in the semiconductor device of the CMOS structure illustrated in FIG. 24, when the NMOS transistor and the PMOS transistor include the sidewall insulating films of the same structure, it is difficult to improve the characteristics of both.

SUMMARY

According to one aspect of embodiments, there is provided a semiconductor device including a silicon substrate having a first device region and a second device region, an n-channel transistor including first source/drain regions formed in the first device region with a first channel region sandwiched therebetween, and a first gate electrode formed over the first channel region with a first gate insulating film formed therebetween, a first sidewall insulating film formed on the side wall of the first gate electrode and having a Young's modulus smaller than a Young's modulus of silicon, a p-channel transistor including second source/drain regions formed in the second device region with a second channel region formed therebetween, and a second gate electrode formed over the second channel region with a second gate insulating film formed therebetween, a second sidewall insulating film formed on the side wall of the second gate electrode and having a Young's modulus which is larger than the Young's modulus of silicon and is larger than the Young's modulus of the first sidewall insulating film, a tensile stressor film formed covering the n-channel transistor and applying to the first channel region a compressive stress perpendicular to a channel plane and a tensile stress in a channel length direction, and a compressive stressor film formed covering the p-channel transistor and applying to the second channel region a tensile stress perpendicular to a channel plane and a compressive stress in a channel length direction.

According to another aspect of embodiments, there is provided a method of manufacturing a semiconductor device including an n-channel transistor formed in a first device region of a silicon substrate, and a p-channel transistor formed in a second device region of the silicon substrate, including forming a first gate electrode of the n-channel transistor over the first device region with a first gate insulating film formed therebetween, a second gate electrode of the p-channel transistor over the second device region with a second gate insulating film formed therebetween, forming a first insulating film having a Young's modulus smaller than a Young's modulus of silicon over the silicon substrate with the first gate electrode and the second gate electrode formed on, etching the first insulating film selectively in the second device region to thereby make the first insulating film in the second device region thinner than the first insulating film in the first device region, forming over the first insulating film a second insulating film having a Young's modulus larger than the Young's modulus of silicon, anisotropically etching the second insulating film and the first insulating film to thereby form on a side wall of the first gate electrode a first sidewall insulating film including the first insulating film and having a Young's modulus smaller than the Young's modulus of silicon, and form on a side wall of the second gate electrode a second sidewall insulating film having a layer structure of the first insulating film and the second insulating film and having a Young's modulus which is larger than the Young's modulus of silicon and is larger than the Young's modulus of the first sidewall insulating film and forming, covering the n-channel transistor, a tensile stressor film which applies to a channel region of the n-channel transistor a compressive stress perpendicular to a channel plane and a tensile stress in a channel length direction, and forming, covering the p-channel transistor, a compressive stressor film which applies to a channel region of the p-channel transistor a tensile stress perpendicular to a channel plane and a compressive stress in a channel length direction.

According to further another aspect of embodiments, there is provided a method of manufacturing a semiconductor device including an n-channel transistor formed in a first device region of a silicon substrate, and a p-channel transistor formed in a second device region of the silicon substrate, including forming a first gate electrode of the n-channel transistor over the first device region with a first gate insulating film formed therebetween, a second gate electrode of the p-channel transistor over the second device region with a second gate insulating film formed therebetween, forming a first insulating film having a Young's modulus smaller than a Young's modulus of silicon over the silicon substrate with the first gate electrode and the second gate electrode, forming a second insulating film having a Young's modulus larger than the Young's modulus of silicon over the first insulating film, anisotropically etching the second insulating film and the first insulating film to thereby form a first sidewall insulating film and a second sidewall insulating film which have a layer structure of the first insulating film and the second insulating film and have a Young's modulus larger than the Young's modulus of silicon respectively on a side wall of the first gate electrode and a side wall of the second gate electrode, removing selectively the second insulating film of the first sidewall insulating film, and forming, covering the n-channel transistor, a tensile stressor film which applies to a channel region of the n-channel transistor a compressive stress perpendicular to a channel plane and a tensile stress in a channel length direction, and forming, covering the p-channel transistor, a compressive stressor film which applies to a channel region of the p-channel transistor a tensile stress perpendicular to a channel plane and a compressive stress in a channel length direction.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 2 is a graph illustrating the kinds of stresses needed to enhance the carrier mobility disclosed in S. E. Thompson et al.;

DESCRIPTION OF EMBODIMENTS

A First Embodiment

A semiconductor device and a method of manufacturing the same according to a first embodiment will be explained with reference to FIGS. 1 to 10B.

Figure 1:
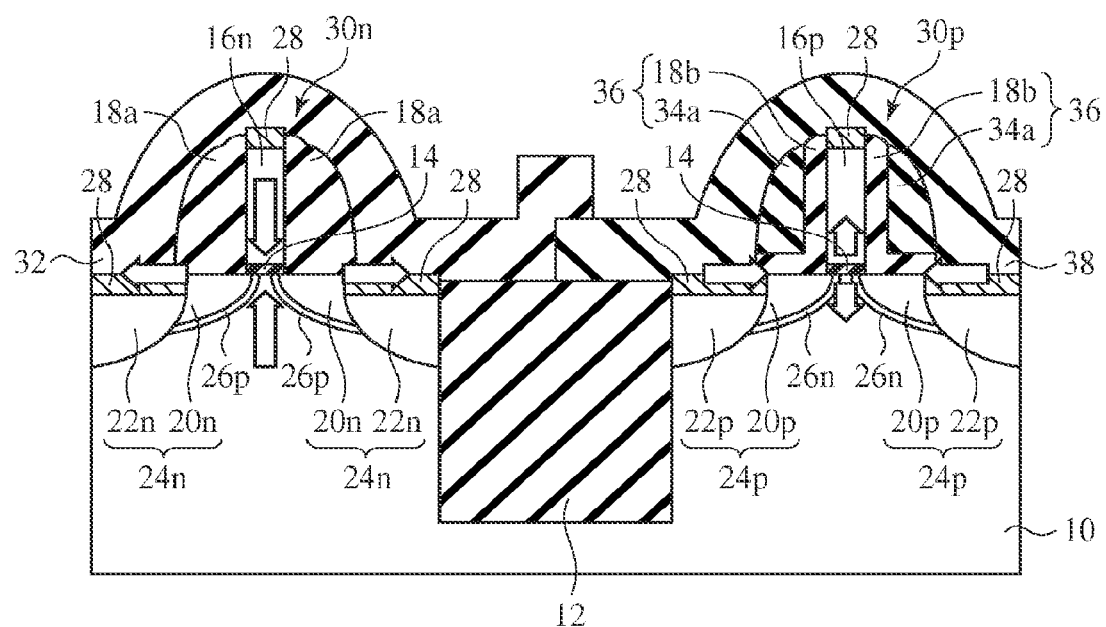
FIG. 1 is a diagrammatic sectional view illustrating a structure of the semiconductor device according to a first embodiment.
Figure 3:
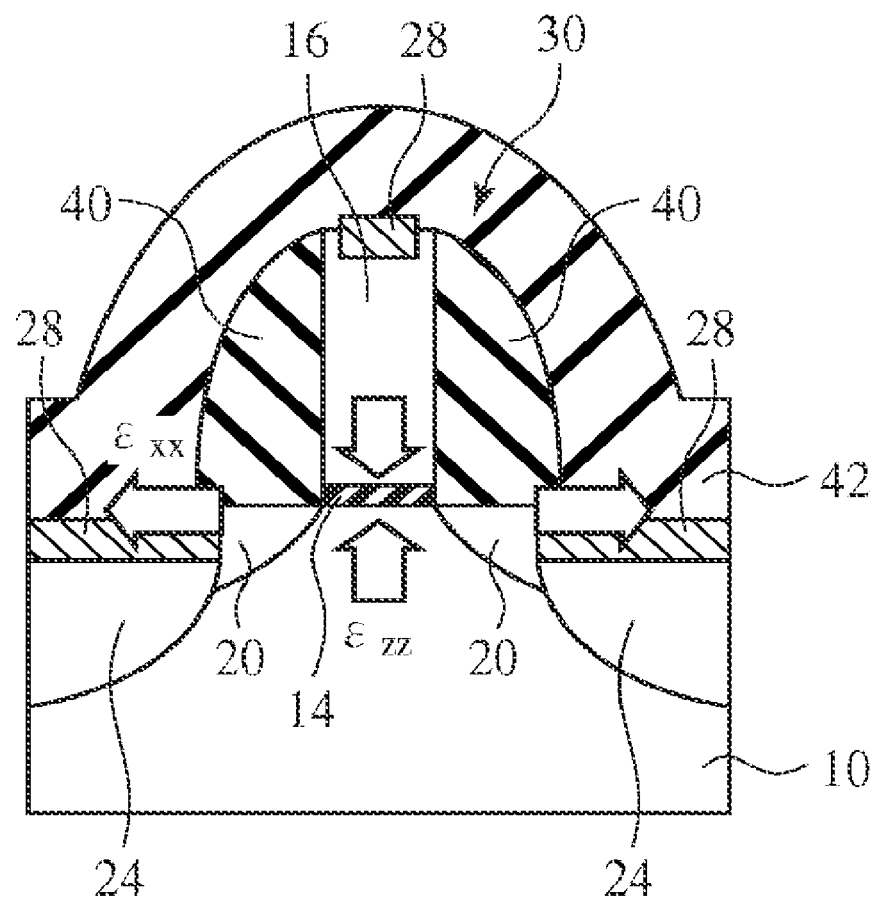
FIG. 3 is a diagrammatic sectional view illustrating the structure of the MOS transistor the simulation was made on in terms of the relationships of the Young's modulus of the sidewall insulating film and the stresses of the channel region.

FIG. 1 is a diagrammatic sectional view illustrating a structure of the semiconductor device according to the present embodiment. FIG. 2 is a graph illustrating the kinds of stresses needed to enhance the carrier mobility disclosed in S. E. Thompson et al. FIG. 3 is a diagrammatic sectional view illustrating the structure of the MOS transistor the simulation was made on in terms of the relationships of the Young's modulus of the sidewall insulating film and the stresses of the channel region.

Figure 4:
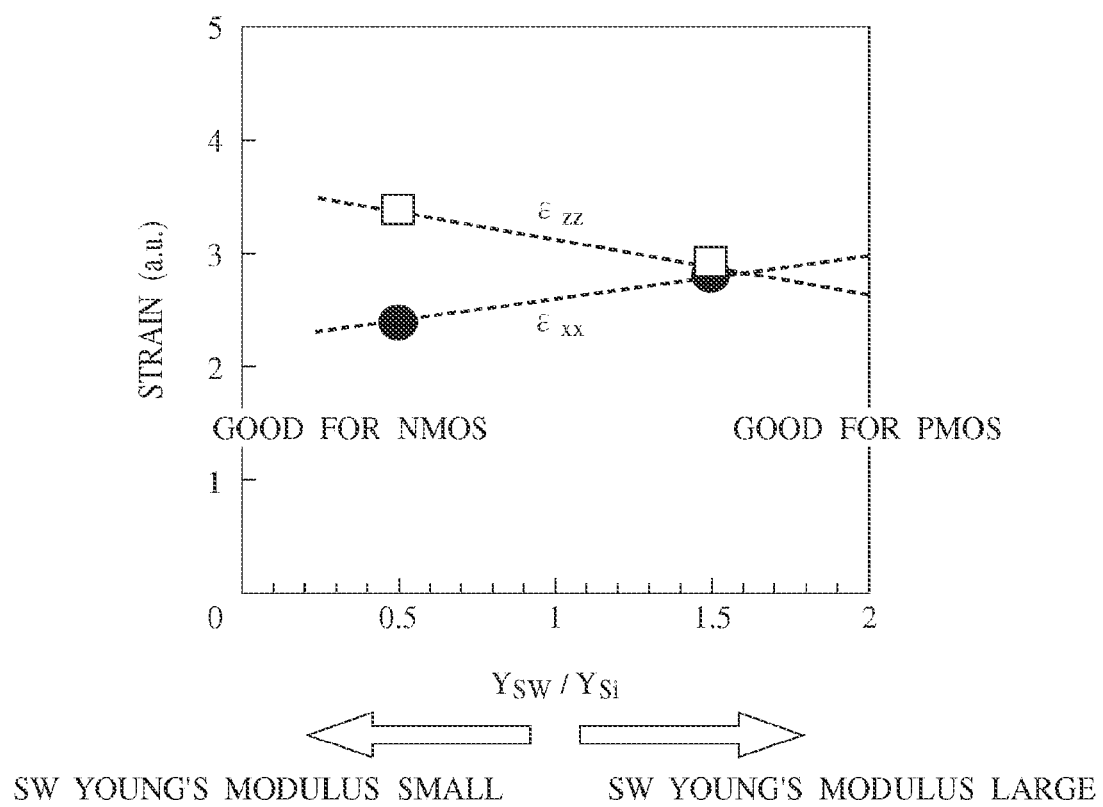
FIG. 4 is a graph illustrating the result of the simulation made on the relationships between the Young's modulus of the sidewall insulating film and the stresses of the channel region.

FIG. 4 is a graph illustrating the result of the simulation made on the relationships between the Young's modulus of the sidewall insulating film and the stresses of the channel region. FIGS. 5A-10B are sectional views illustrating a method of manufacturing the semiconductor device according to the present embodiment.

First, the structure of the semiconductor device according to the present embodiment will be explained with reference to FIGS. 1 to 4.

As illustrated in FIG. 1, a device isolation film 12 for defining device regions is formed in a surface of a silicon substrate 10. The device region on the left side of the drawing is an NMOS (n-channel metal-oxide-semiconductor) transistor forming region, and the device region on the right side of the drawing is a PMOS (p-channel metal-oxide-semiconductor) transistor forming region. In the silicon substrate 10 in the NMOS transistor forming region, a p-type well (not illustrated) is formed. In the silicon substrate 10 in the PMOS transistor forming region, an n-type well (not illustrated) is formed.

Over the silicon substrate 10 in the NMOS transistor forming region, a gate electrode 16n is formed with a gate insulating film 14 interposed therebetween. On a side wall of the gate electrode 16n, a sidewall insulating film 18a of silicon oxide film, whose Young's modulus is smaller than the Young's modulus of silicon, is formed.

In the silicon substrate 10 on both sides of the gate electrode 16n, n-type source/drain regions 24n formed of shallow n-type impurity diffused regions 20n forming the extension regions of the extension source/drain structure, and deep n-type impurity diffused regions 22n. Below the shallow n-type impurity diffused regions 20n, p-type pocket regions 26p which function as the punch-through stopper are formed. The region sandwiched by the n-type source/drain regions 24n is the channel region.

On the gate electrode 16n and the n-type source/drain regions 24n, metal silicide films 28 are formed.

Thus, on the silicon substrate in the NMOS transistor forming region, an NMOS transistor 30n including the gate electrode 16n and the n-type source/drain regions 24n is formed.

Over the NMOS transistor 30n, a tensile stressor film 32 having a tensile stress is formed, covering the NMOS transistor 30n. As the tensile stressor film 32, silicon nitride film having the tensile stress is formed. The tensile stressor film 32 is an insulating film which may function also as the etching stopper when contact holes connected to the NMOS transistors 30n are formed by etching.

The tensile stressor film 32 is for applying a stress to the channel region of the NMOS transistor 30n. As indicated by the arrows in FIG. 1, the tensile stressor film 32 applies to the channel region of the NMOS transistor 30n a compressive stress perpendicularly to the channel plane and a tensile stress toward the source/drain, i.e., in a channel length direction. As will be described later, the compressive stress applied perpendicularly to the channel plane is equal to or more than the tensile stress applied in the channel length direction. Due to the stresses thus applied by the tensile stressor film 32, a compressive strain and a tensile strain are introduced in the channel region of the NMOS transistor 30n respectively perpendicularly to the channel plane and in the channel length direction.

Over the silicon substrate 10 in the PMOS transistor forming region, a gate electrode 16p is formed with the gate insulating film interposed therebetween. On a side wall of the gate electrode 16p, a sidewall insulating film 36 of the layer structure formed of a silicon oxide film 18b, whose Young's modulus is smaller than the Young's modulus of silicon, and a silicon nitride film 34a, whose Young's modulus is larger than the Young's modulus of silicon, is formed. The silicon oxide film 18b is thinner than the silicon oxide film of the sidewall insulating film 18a of the NMOS transistor 30n. The average Young's modulus of the sidewall insulating film 36 is larger due to the presence of the silicon nitride film 34a than the Young's modulus of silicon and the Young's modulus of the sidewall insulating film 18a formed of the silicon oxide film.

In the silicon substrate 10 on both sides of the gate electrode 16p, p-type source/drain regions 24p formed of the shallow p-type impurity diffused regions 20p forming the extension regions of the extension source/drain structure, and deep p-type impurity diffused regions 22p are formed. Below the shallow p-type impurity diffused regions 20p, n-type pocket regions 26n which function as the punch-through stoppers are formed. The region sandwiched by the p-type source/drain regions 24p is the channel region.

On the gate electrode 16p and the p-type source/drain regions 24p, metal silicide films 28 are formed.

Thus, on the silicon substrate 10 in the PMOS transistor forming region, a PMOS transistor 30p including the gate electrode 16p and the p-type source/drain regions 24p is formed.

Over the PMOS transistor 30p, a compressive stressor film 38 having a compressive stress is formed, covering the PMOS transistor 30p. As the compressive stressor film 38, silicon nitride film having compressive stress is formed. The compressive stressor film 38 is an insulating film which may function also as the etching stopper when contact holes connected to the PMOS transistor 30p are formed.

The compressive stressor film 38 is a film for applying stresses to the channel region of the PMOS transistor 30p. To the channel region of the PMOS transistor 30p, as indicated by the arrows in FIG. 1, a tensile stress is applied perpendicularly to the channel plane, and a compressive stress is applied toward the source/drains, i.e., in the channel length direction. As will be described layer, the compressive stress in the channel length direction is larger than the tensile stress perpendicular to the channel plane. Due to the stresses thus applied to the compressive stressor film 38, a tensile strain and a compressive strain are introduced in the channel region of the PMOS transistor 30p respectively perpendicularly to the channel plane and in the channel length direction.

Thus, the semiconductor device according to the present embodiment, which has the CMOS structure, is constituted.

In semiconductor device according to the present embodiment, in the NMOS transistor 30n covered with the tensile stressor film 32, the sidewall insulating film 18a of silicon oxide film, whose Young's modulus is smaller than the Young's modulus of silicon, is formed. In the PMOS transistor 30p covered with the compressive stressor film 38, the sidewall insulating film 36 of the layer structure of the silicon oxide film 18b thinner than the sidewall insulating film 18a, and the silicon nitride film 34a, whose Young's modulus is larger than the Young's modulus of silicon, is formed.

Thus, in the NMOS transistor 30n, the Young's modulus of the sidewall insulating film 18a is smaller than the Young's modulus of silicon while in the PMOS transistor 30p, the Young's modulus of the sidewall insulating film 36 is larger than the Young's modulus of silicon and larger than the Young's modulus of the sidewall insulating film 18a.

In the NMOS transistor covered with the tensile stressor film and the PMOS transistor covered with the compressive stressor film, when both have the sidewall insulating films of the same structure, as described above, it is difficult to enhance the characteristics of both. This will be because the type of the stress needed to enhance the carrier mobility differs between the NMOS transistor and the PMOS transistor.

FIG. 2 is a view illustrating the types of the stresses needed to enhance the carrier mobility described in S. E. Thompson et al. ("A 90-nm logic technology featuring strained-silicon," IEEE Trans. Elec. Dev., Vol. 51, No. 11, pp. 1790-1797, November 2004). In FIG. 2, which of "Tension" (tensile stress) and "Compression" (compressive stress) is needed to enhance the carrier mobility in three directions of "Longitudinal" (channel length direction), "Transverse" (channel width direction) and "Out-of-plane" (perpendicularly to the channel plane) respectively for the NMOS transistor and the PMOS transistor. The "+" marks indicated together with the types of the stresses indicate the effectiveness of the stresses enhancing the carrier mobility, and larger numbers of the "+" mark means that the stresses are more effective to enhance the carrier mobility.

In FIG. 2, it is found that for the NMOS transistor, as the stresses to be applied to the channel region, the compressive stress perpendicular to the channel plane is firstly effective, and the tensile stress in the channel length direction is secondly effective to enhance the carrier mobility. It is found that for the PMOS transistor, as the stresses to be applied to the channel region, the compressive stress in the channel length direction is effective to enhance the carrier mobility.

On the other hand, the inventor of the present application gave by simulation the relationships of the stress to be introduced into the channel region of the MOS transistor and the Young's modulus of the sidewall insulating film so as to make clear the influence of the sidewall insulating film on the stress to be introduced into the channel region due to the stress of the stressor film covering the MOS transistor. FIG. 3 is a diagrammatic sectional view illustrating the structure of the MOS transistor the simulation was made, and FIG. 4 is a graph illustrating the simulation result.

As illustrated in FIG. 3, the MOS transistor 30 on which the simulation was made includes a gate electrode 16 formed on a silicon substrate 10 with a gate insulating film 214 formed therebetween, and source/drain regions 24 formed in the silicon substrate 10 on both sides of the gate electrode 15. On the side wall of the gate electrode 16, a sidewall insulating film 40 is formed. On the gate electrode 16 and the source/drain regions 24, a metal silicide film 28 is formed. On the MOS transistor 30, a stressor film 42 for applying a stress to the channel region, covering the MOS transistor 30.

In the simulation, for $Y_{SW}/Y_{Si}$ wherein the Young's modulus of the sidewall insulating film 40 is $Y_{SW}$, and the Young's modulus of silicon is $Y_{Si}$ the strain $\epsilon_{xx}$ in the channel length direction and the strain $\epsilon_{zz}$ perpendicular to the channel plane to be introduced into the channel region due to the stress of the stressor film 42 were given.

FIG. 4 is a graph illustrating the result of this simulation. $Y_{SW}/Y_{Si}$ is taken on the horizontal axis of the graph, and on the vertical axis, the stress is taken. The "●" mark plots indicate strains $\epsilon_{xx}$ in the channel length direction and the "□" mark plots indicate the strain $\epsilon_{zz}$ perpendicular to the channel plane.

As shown in FIG. 4, as the Young's modulus $Y_{SW}$ of the sidewall insulating film increases, the strain $\epsilon_{zz}$ perpendicular to the channel plane decreases, while the strain $\epsilon_{xx}$ in the channel length direction increases. With the proximity to $Y_{SW}/Y_{Si}=1.6$ as a boundary value, when the $Y_{SW}/Y_{Si}$ is smaller than the boundary value, the strain $\epsilon_{zz}$ perpendicular to the channel plane is larger than the strain $\epsilon_{xx}$ in the channel length direction, and when the $Y_{SW}/Y_{Si}$ is larger than the boundary value, the strain $\epsilon_{xx}$ in the channel length direction is larger than the strain $\epsilon_{zz}$ perpendicular to the channel plane.

Based on the types of the stresses needed to enhance the carrier mobility illustrated in FIG. 2 and the simulation result illustrated in FIG. 4, to enhance the carrier mobility of the NMOS transistor and the PMOS transistor, it is found that the stresses to be applied to the channel regions may be set as follows.

First, for the NMOS transistor, in the channel region, the compressive stress perpendicular to the channel plane may be set equal or more than the tensile stress in the channel length direction.

For the PMOS transistor, in the channel region, the compressive stress in the channel length direction may be set larger than the tensile stress perpendicular to the channel plane.

However, when the NMOS transistor and the PMOS transistor respectively include the sidewall insulating films of the same structure, the Young's moduli of the sidewall insulating films of the NMOS transistor and the PMOS transistor are equal to each other. Accordingly, the stresses to be applied to the channel regions cannot be optimized independently of each other. That is, when the Young's modulus of the sidewall insulating film is made small in the NMOS transistor to increase the compressive stress perpendicular to the channel plane, which is effective to enhance the carrier mobility, the compressive stress in the channel length direction, which is effective to enhance the carrier mobility, cannot be increased simultaneously in the PMOS transistor. Oppositely, when the Young's modulus of the sidewall insulating film is made large in the PMOS transistor to increase the compressive stress in the channel length direction, the compressive stress perpendicular to the channel plane cannot be increased simultaneously in the NMOS transistor.

In the semiconductor device according to the present embodiment, however, in the NMOS transistor 30n, the sidewall insulating film 18, whose Young's modulus is smaller than the Young's modulus of silicon, is formed, and in the PMOS transistor 30p, the sidewall insulating film 36, whose Young's modulus is larger than the Young's modulus of the sidewall insulating film 18a, is formed.

Thus, in the NMOS transistor 30n, in the channel region, the compressive stress perpendicular to the channel plane can be increased, and the compressive stress perpendicular to the channel plane is set equal or more than the tensile stress in the channel length direction. Thus, the carrier mobility of the NMOS transistor 30n can be improved.

In the PMOS transistor 30p, in the channel region, the compressive stress in the channel length direction can be increased, and the compressive stress in the channel length direction is set larger than the tensile stress perpendicular to the channel plane. Thus, the carrier mobility of the PMOS transistor 30p can be improved.

Thus, according to the present embodiment, in both the NMOS transistor 30n and the PMOS transistor 30p, the drive current can be increased, and the characteristics can be improved. According to the present embodiment, the characteristics of the semiconductor device having the CMOS structure can be improved.

Next, the method of manufacturing the semiconductor device according to the present embodiment will be explained with reference to FIGS. 5A to 10B.

First, the device isolation film 12 for defining device regions is formed in the surface of the silicon substrate 10. In the drawing, the device region on the left side is the NMOS transistor forming region, and the device region on the right side is the PMOS transistor forming region.

Next, a p-type well (not illustrated) is formed in the silicon substrate 10 in the NMOS transistor forming region, and an n-type well (not illustrated) is formed in the silicon substrate 10 in the PMOS transistor forming region.

Next, a silicon oxynitride film of a 1.2 nm-thickness, for example, is deposited by, e.g., CVD method to form the gate insulating film 14 of the silicon oxynitride film. The gate insulating film 14 is not limited to silicon oxynitride film, and any other insulating film can be suitably formed. For example, as the gate insulating film 14, silicon oxide film may be formed by thermal oxidation.

Then, a polycrystalline silicon film of a 100 nm-thickness, for example, is deposited by, e.g., CVD method.

Figure 5A:
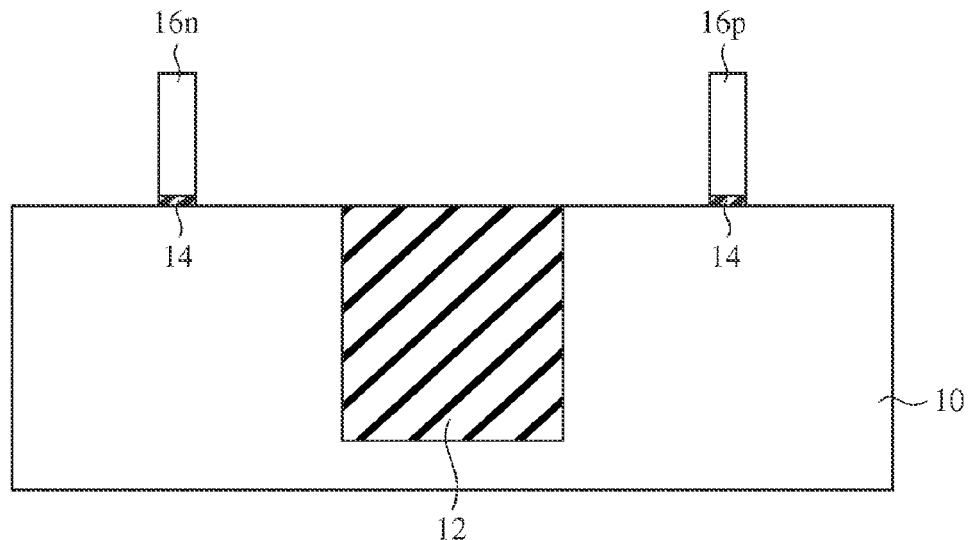
FIGS. 5A-5B, 6A-6B, 7A-7B, 8A-8B, 9A-9B and 10A-10B are sectional views illustrating a method of manufacturing the semiconductor device according to the first embodiment.

Then, the polycrystalline silicon film was patterned by photolithography and dry etching to form the gate electrodes 16n, 16p of the polycrystalline silicon film (FIG. 5A). The gate electrode 16n is of the NMOS transistor 30n, and the gate electrode 16p is of the PMOS transistor 30p.

Next, a photoresist film (not illustrated) covering the PMOS transistor forming region and exposing the NMOS transistor forming region is formed, and with the gate electrode 16n as the mask, ion implantation is made to form the p-type pocket regions 26p in the NMOS transistor forming region.

Next, with the gate electrode 16n as the mask, ion implantation is made to form in the silicon substrate 10 on both sides of the gate electrode 16n, the shallow n-type impurity diffused regions 20n forming the extension regions of the extension source/drain structure. After the ion implantation has been made, the photoresist film is removed.

Next, a photoresist film (not illustrated) covering the NMOS transistor forming region and exposing the PMOS transistor forming region is formed, and then with the gate electrode 16p as the mask, ion implantation is made to form the n-type pocket regions 26n in the PMOS transistor forming region.

Figure 5B:
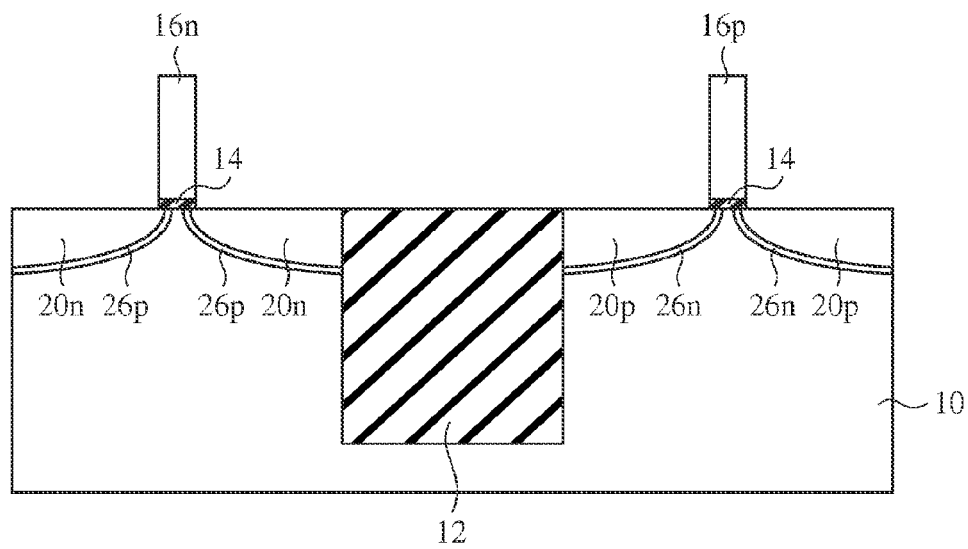

Then, with the gate electrode 16p as the mask, ion implantation is made to form in the silicon substrate 10 on both sides of the gate electrode 16p, the shallow p-type impurity diffused regions 20p forming the extension regions of the extension source/drain structure. After the ion implantation has been made, the photoresist film is removed (FIG. 5B).

Figure 6A:
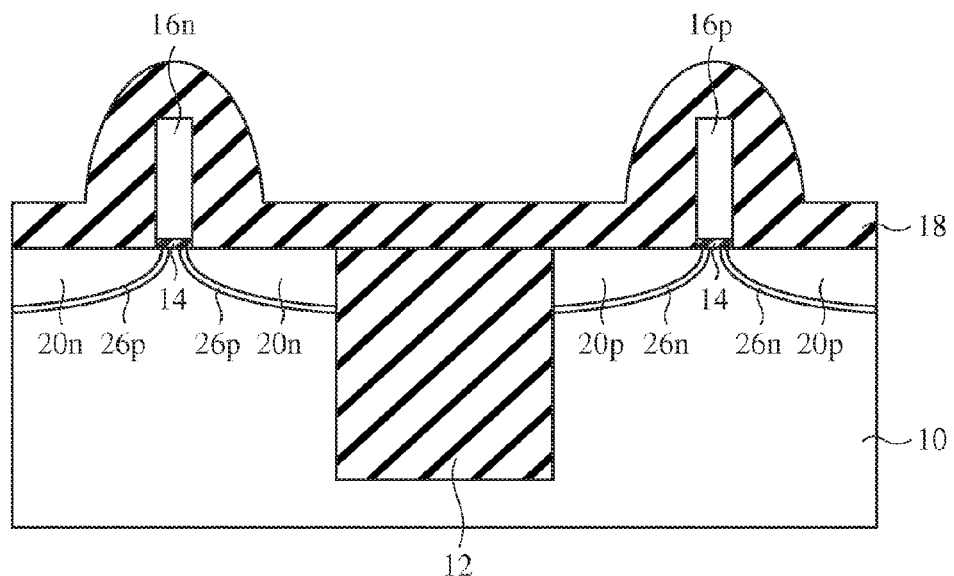

Next, a silicon oxide film 18 of a 40 nm-thickness, for example, whose Young's modulus is smaller than the Young's modulus of silicon, is deposited over the entire surface by, e.g., CVD method (FIG. 6A).

Next, by photolithography, a photoresist film 50 covering the NMOS transistor forming region and exposing the PMOS transistor forming region is formed.

Figure 6B:
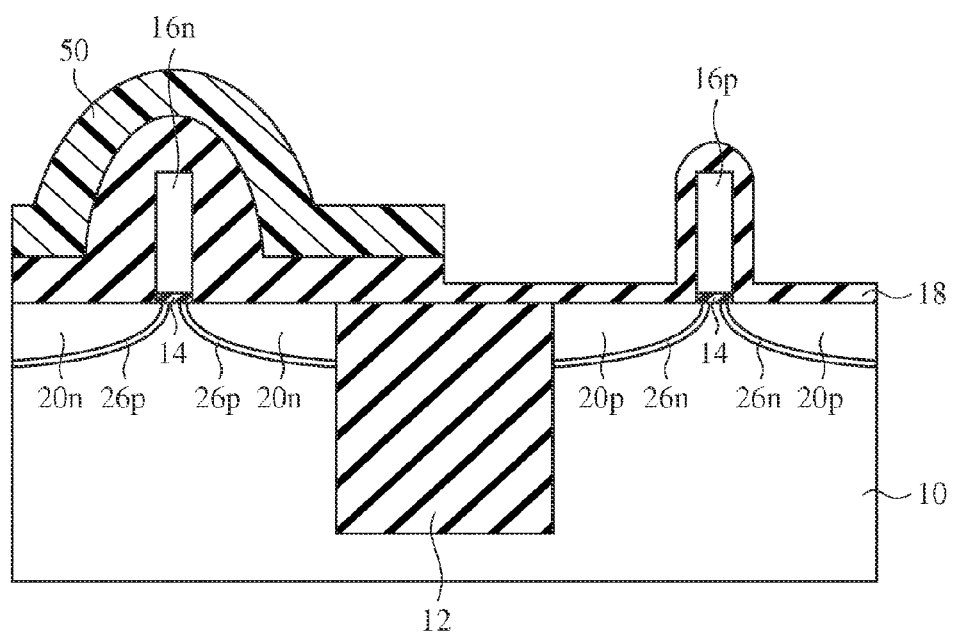

Then, with the photoresist film 50 as the mask, wet etching is made with, e.g., a hydrofluoric acid-based aqueous solution to thin the silicon oxide film 18 in the PMOS transistor forming region to e.g., about 5 nm-thickness. Thus, the silicon oxide film 18 in the PMOS transistor forming region is made thinner than the silicon oxide film 18 in the NMOS transistor forming region (FIG. 6B).

Next, the photoresist film 50 is removed.

Figure 7A:
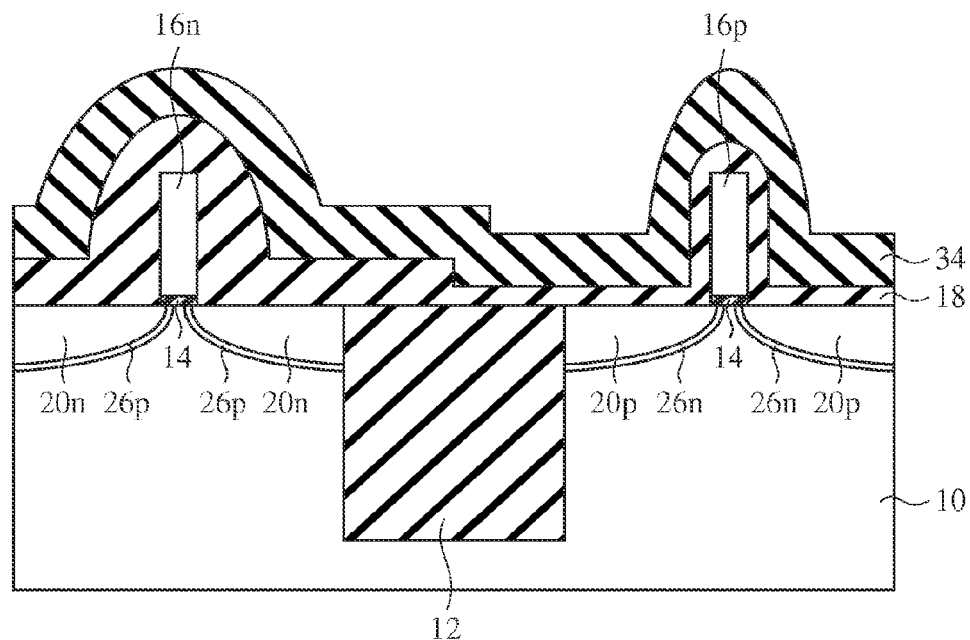

Then, a silicon nitride film 34 of a 40 nm-thickness, for example, whose Young's modulus is larger than the Young's modulus of silicon, is deposited on the silicon oxide film 18 by, e.g., plasma CVD method (FIG. 7A).

Figure 7B:
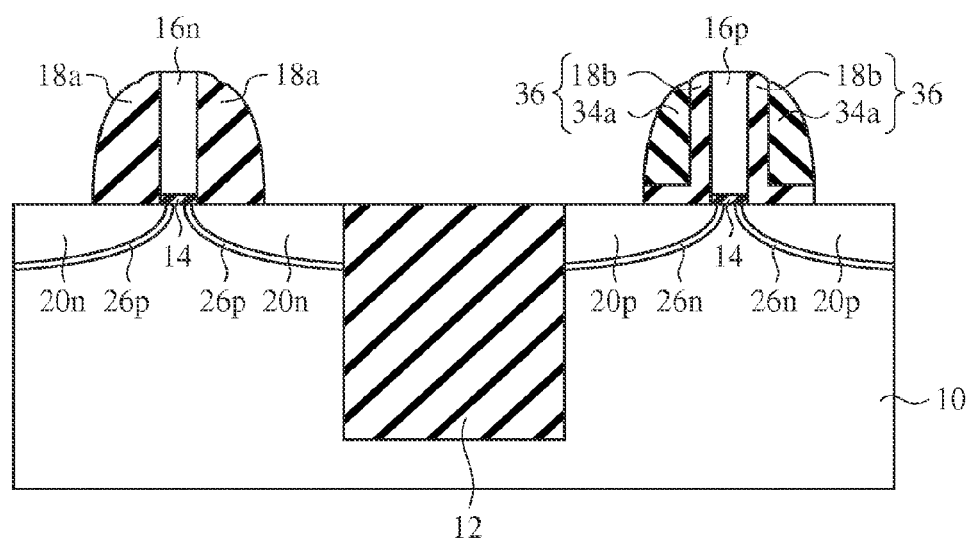

Next, the silicon nitride film 34 and silicon oxide film 18 are anisotropically etched by dry etching, e.g., RIE or others. Thus, in the NMOS transistor forming region, because of the relatively thick silicon oxide film 18, the silicon nitride film 34 is removed, and the sidewall insulating film 18a of silicon oxide film 18 is formed on the side wall of the gate electrode 16n. On the other hand, in the PMOS transistor forming region, because of the relatively thin silicon oxide film 18, the sidewall insulating film of the layer structure of the silicon oxide film 18b and the silicon nitride film 34a is formed on the side wall of the gate electrode 16p (FIG. 7B).

As described above, in the present embodiment, the silicon oxide film 18 in the PMOS transistor forming region is made thinner by wet etching than the silicon oxide film 18 in the NMOS transistor forming region, whereby the sidewall insulating films 18a, 36 have structures different from each other between the NMOS transistor forming region and the PMOS transistor forming region. Accordingly the manufacturing steps are not complicated, and the increase of the manufacturing step number can be suppressed.

Next, a photoresist film (not illustrated) covering the PMOS transistor forming region and exposing the NMOS transistor forming region is formed, and then with the gate electrode 16n and the sidewall insulating film 18a as the mask, ion implantation is made to form the n-type impurity diffused regions 22n forming the deep regions of the n-type source/drain regions in the NMOS transistor forming region. After the ion implantation, the photoresist film is removed.

Then, a photoresist film (not illustrated) covering the NMOS transistor forming region and exposing the PMOS transistor forming region is formed, and then with the gate electrode 16p and the sidewall insulating film 36 as the mask, ion implantation is made to form the p-type impurity diffused region 22p forming the deep regions of the p-type source/drain regions in the PMOS transistor forming region. After the ion implantation, the photoresist film is removed.

Figure 8A:
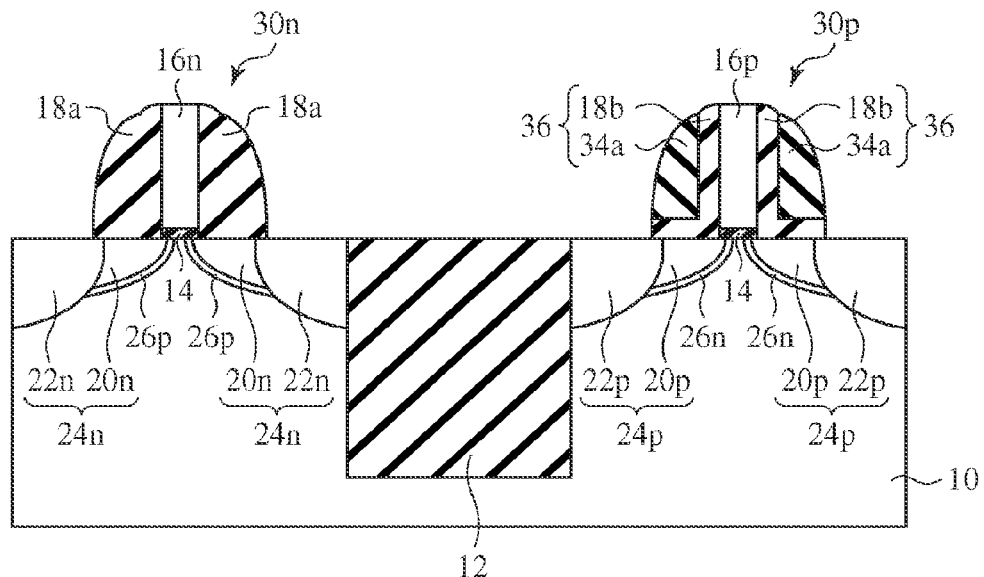

Then, prescribed thermal processing is made to activate the implanted impurities. Thus, in the NMOS transistor forming region, the n-type source/drain regions 24n of the extension source/drain structure including the n-type impurity diffused regions 20n, 22n are formed. Also in the PMOS transistor forming region, the p-type source/drain regions 24p of the extension source/drain structure including the p-type impurity diffused regions 20p, 22p are formed (FIG. 8A).

Thus, the NMOS transistor 30n is formed on the silicon substrate 10 in the NMOS transistor forming region, and on the silicon substrate 10 in the PMOS transistor forming region, the PMOS transistor 30p is formed.

Figure 8B:
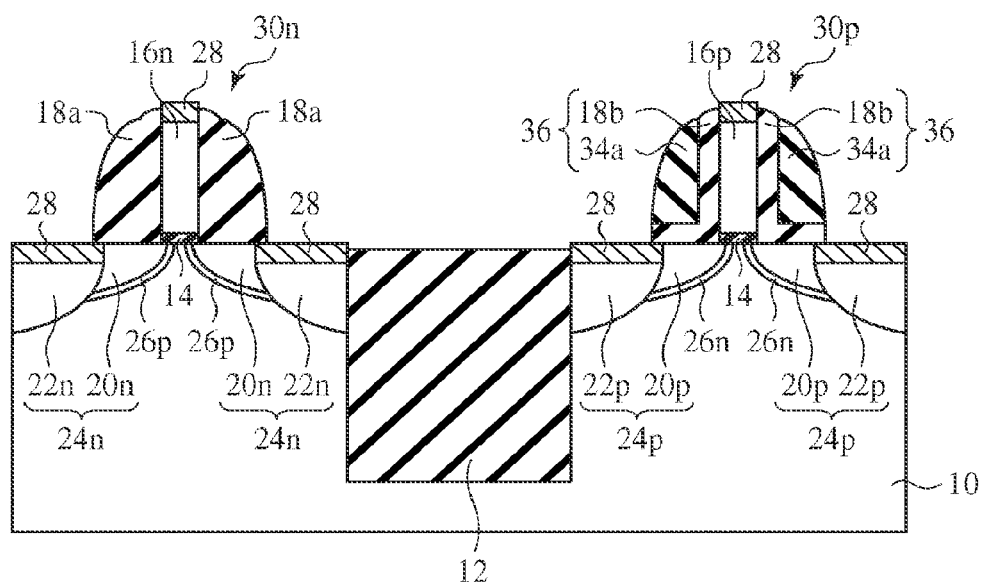

Next, by the usual salicide (self-aligned silicide) process, the metal silicide films 28 are formed on the gate electrodes 16n, 16p and the source/drain regions 24n, 24p (FIG. 8B). As the metal silicide film 28, nickel silicide film, for example, may be formed.

Figure 9A:
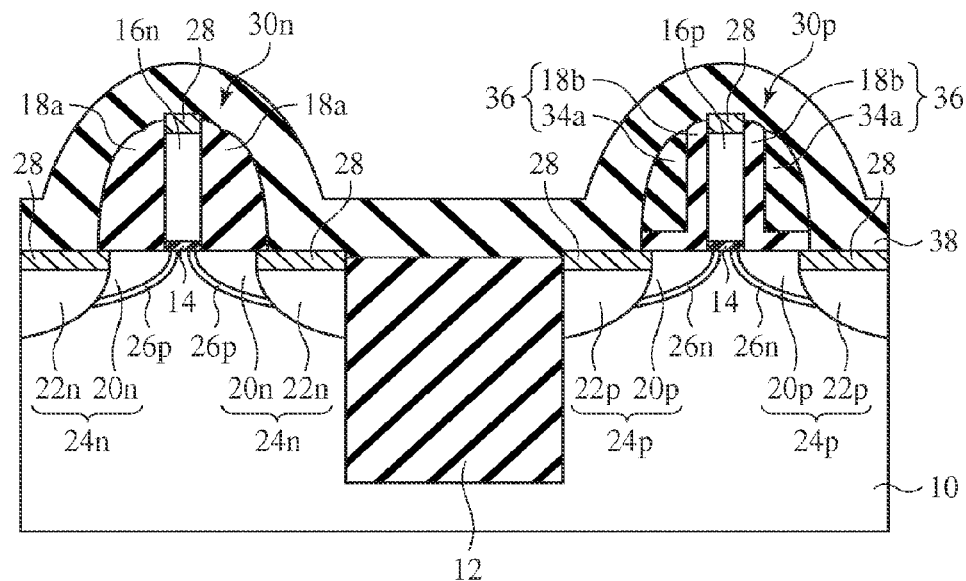

Then, a silicon nitride film 38 of a 60 nm-thickness, for example, having the compressive stress is deposited over the entire surface by, e.g., plasma CVD method (FIG. 9A). The silicon nitride film 38 can have the compressive stress by controlling the film forming condition.

Then, a photoresist film (not illustrated) covering the PMOS transistor forming region and exposing the NMOS transistor forming region is formed, and then with the photoresist film as the mask, wet etching is made to remove the silicon nitride film 38 in the NMOS transistor forming region. After the wet etching, the photoresist film is removed.

Figure 9B:
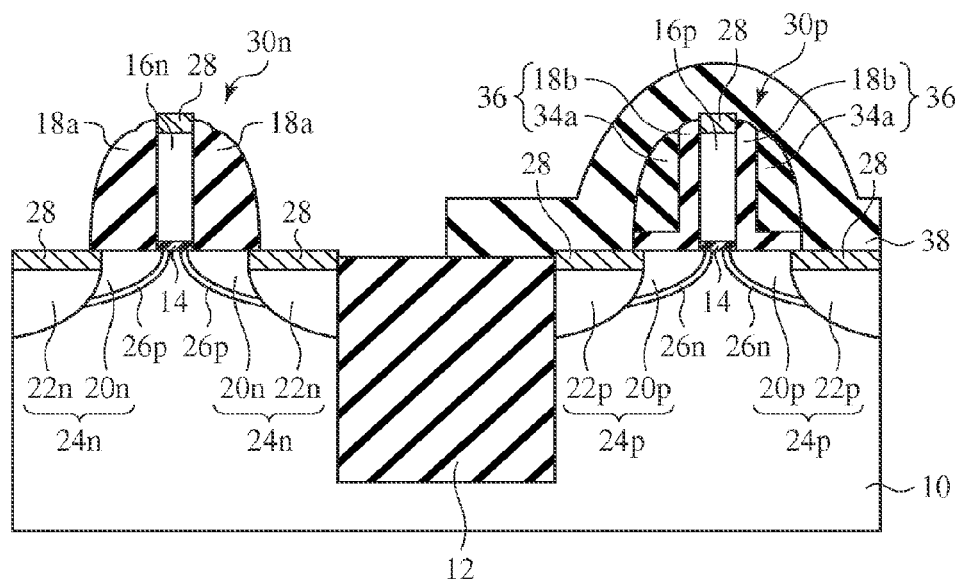

Thus, over the PMOS transistor 30p, the compressive stressor film 38 of silicon nitride film having the compressive stress is formed, covering the PMOS transistor 30p (FIG. 9B).

Figure 10A:
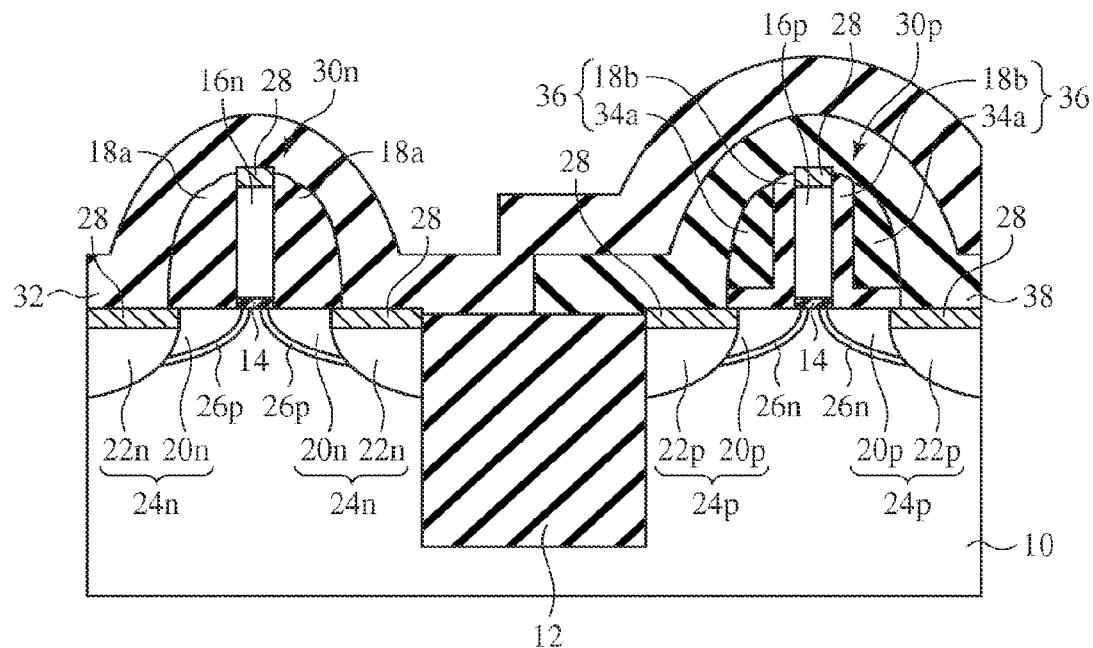

Next, over the entire surface, a silicon nitride film 32 of a 50 nm-thickness, for example, having the tensile stress is formed by, e.g., plasma CVD method (FIG. 10A). The silicon nitride film 38 can have the tensile stress by controlling the film forming condition.

Next, a photoresist film (not illustrated) covering the NMOS transistor forming region and exposing the PMOS transistor forming region is formed, and then with the photoresist film as the mask, wet etching is made to remove the silicon nitride film 32 in the PMOS transistor forming region. After the wet etching, the photoresist film is removed.

Figure 10B:
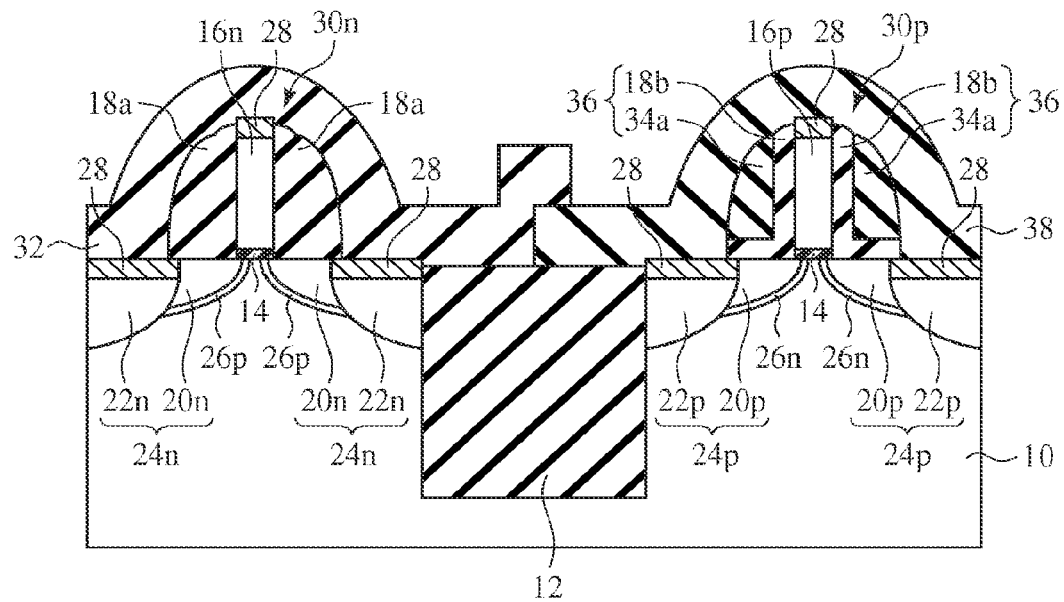

Thus, over the NMOS transistor 30n, the tensile stressor film 32 of silicon nitride film having the tensile stress is formed, covering the NMOS transistor 30n (FIG. 10B).

Thus, the semiconductor device according to the present embodiment illustrated in FIG. 1 is manufactured.

As described above, according to the present embodiment, in the NMOS transistor 30n covered with the tensile stressor film 32, the sidewall insulating film 18a of silicon oxide film, whose Young's modulus is smaller than the Young's modulus of silicon is formed, and in the PMOS transistor 30p covered with the compressive stressor film 38, the sidewall insulating film 36, which has the layer structure of the silicon oxide film 18b and the silicon nitride film 34a and whose Young's modulus is larger than the Young's modulus of silicon and the Young's modulus of the sidewall insulating film 18a is formed, whereby the increase of the manufacturing steps can be suppressed while the characteristics of both the NMOS transistor 30n and the PMOS transistor 30p can be improved. Thus, according to the present embodiment, the characteristics of the semiconductor device of the CMOS structure can be improved.

A Second Embodiment

A semiconductor device and a method of manufacturing the same according to a second embodiment will be explained with reference to FIGS. 11 to 14B.

Figure 11:
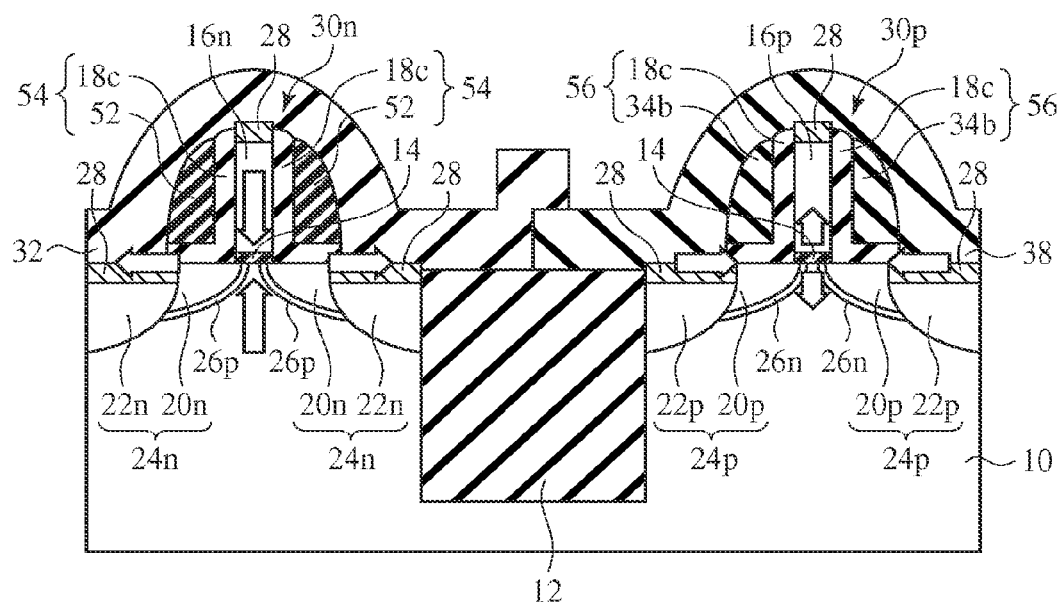
FIG. 11 is a diagrammatic sectional view illustrating a structure of the semiconductor device according to a second embodiment.

FIG. 11 is a diagrammatic sectional view illustrating the structure of the semiconductor device according to the present embodiment. FIGS. 12A to 14B are sectional views illustrating the method of manufacturing the semiconductor device according to the present embodiment. The same members of the present embodiment as those of the semiconductor device and the method of manufacturing the same according to the first embodiment are represented by the same reference numbers not to repeat or to simplify their explanation.

First, the structure of the semiconductor device according to the present embodiment will be explained with reference to FIG. 11.

In the semiconductor device according to the present embodiment, as illustrated, a sidewall insulating film 54 of the layer structure of a silicon oxide film 18c, whose Young's modulus is smaller than the Young's modulus of silicon, and a silicon oxynitride film 52, whose Young's modulus is equal to or below the Young's modulus of silicon, is formed on the side wall of the gate electrode 16n of an NMOS transistor 30n covered with a tensile stressor film 32. The average Young's modulus of the sidewall insulating film 54 is smaller than the Young's modulus of silicon.

On the side wall of the gate electrode 16p of a PMOS transistor 30p covered with a compressive stressor film 38, a sidewall insulating film 56 of the layer structure of a silicon oxide film 18c, whose Young's modulus is smaller than the Young's modulus of silicon, and a silicon nitride film 34b, whose Young's modulus is larger than the Young's modulus of silicon, is formed. The silicon oxide film 18c forming the sidewall insulating film 56 has a film thickness substantially equal to that of the silicon oxide film 18c forming the sidewall insulating film 54. The average Young's modulus of the sidewall insulating film 56 is, because of the silicon nitride film 34b, larger than the Young's modulus of silicon and larger than the average Young's modulus of the sidewall insulating film 54.

As described above, in the semiconductor device according to the present embodiment, in the NMOS transistor 30n covered with the tensile stressor film 32, the sidewall insulating film 54 of the layer structure of the silicon oxide film 18c, whose Young's modulus is smaller than the Young's modulus of silicon, and the silicon oxynitride film 52, whose Young's modulus is equal to or smaller than the Young's modulus of silicon, is formed. In the PMOS transistor 30 covered with the compressive stressor film 38, the sidewall insulating film 56 of the layer structure of the silicon oxide film 18c, whose Young's modulus is smaller than the Young's modulus of silicon, and the silicon nitride film 34b, whose Young's modulus is larger than the Young's modulus of silicon, is formed.

In the semiconductor device according to the present embodiment, because of the thus-structured sidewall insulating films 54, 56, in the NMOS transistor 30n, the average Young's modulus of the sidewall insulating film 54 is smaller than the Young's modulus of silicon, and in the PMOS transistor 30p, the average Young's modulus of the sidewall insulating film 56 is larger than the Young's modulus of silicon and larger than the average Young's modulus of the sidewall insulating film 54.

Thus, in the semiconductor device according to the present embodiment as well as in the semiconductor device according to the first embodiment, in the NMOS transistor 30n, in the channel region, the compressive stress perpendicular to the channel plane is set equal to or more than the tensile stress in the channel length direction, whereby the carrier mobility of the NMOS transistor 30n can be increased.

In the PMOS transistor 30p, in the channel region, the compressive stress in the channel length direction is set larger than the tensile stress perpendicular to the channel plane, whereby the carrier mobility of the PMOS transistor can be increased.

Thus, according to the present embodiment, in both the NMOS transistor 30n and the PMOS transistor 30p, the drive current can be increased, and the characteristics can be improved. According to the present embodiment, the characteristics of the semiconductor device of the CMOS structure can be improved.

Next, the method of manufacturing the semiconductor device according to the present embodiment will be explained with reference to FIGS. 12A to 14B.

First, in the same way as in the method of manufacturing the semiconductor device according to the first embodiment illustrated in FIGS. 5A and 5B, the semiconductor device is formed up to the impurity diffused regions 20n, 20p.

Then, over the entire surface, a silicon oxide film 18 of a 20 nm-thickness, for example, is formed by, e.g., CVD method.

Figure 12A:
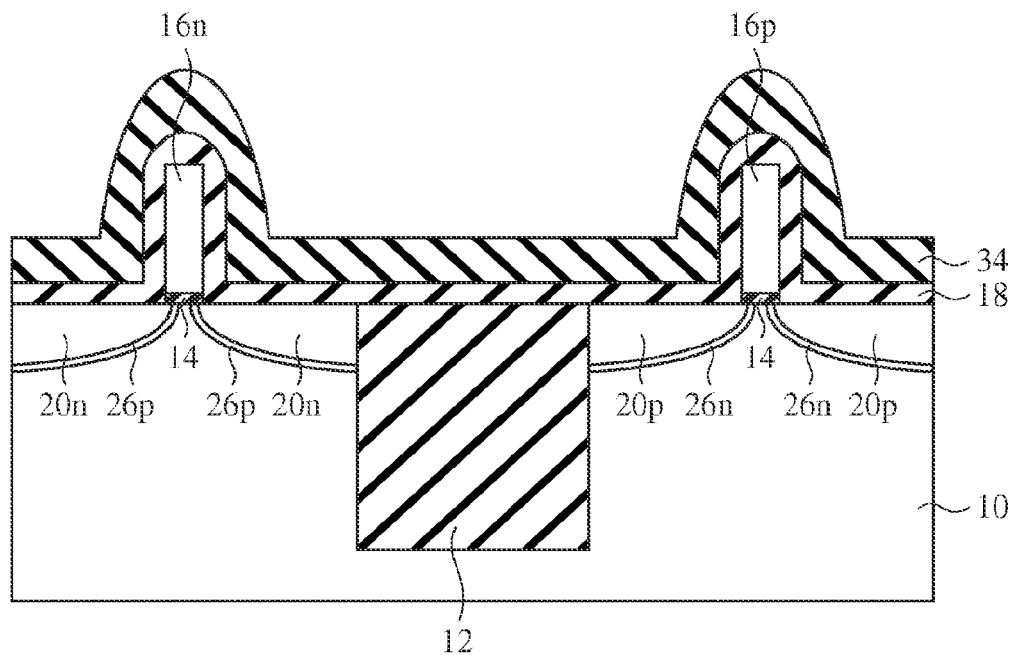
FIGS. 12A-12B, 13A-13B and 14A-14B are sectional views illustrating a method of manufacturing the semiconductor device according to the second embodiment.

Next, on the silicon oxide film 18, a silicon nitride film 34 of a 50 nm-thickness, for example, is formed by, e.g., plasma CVD method (FIG. 12A).

Figure 12B:
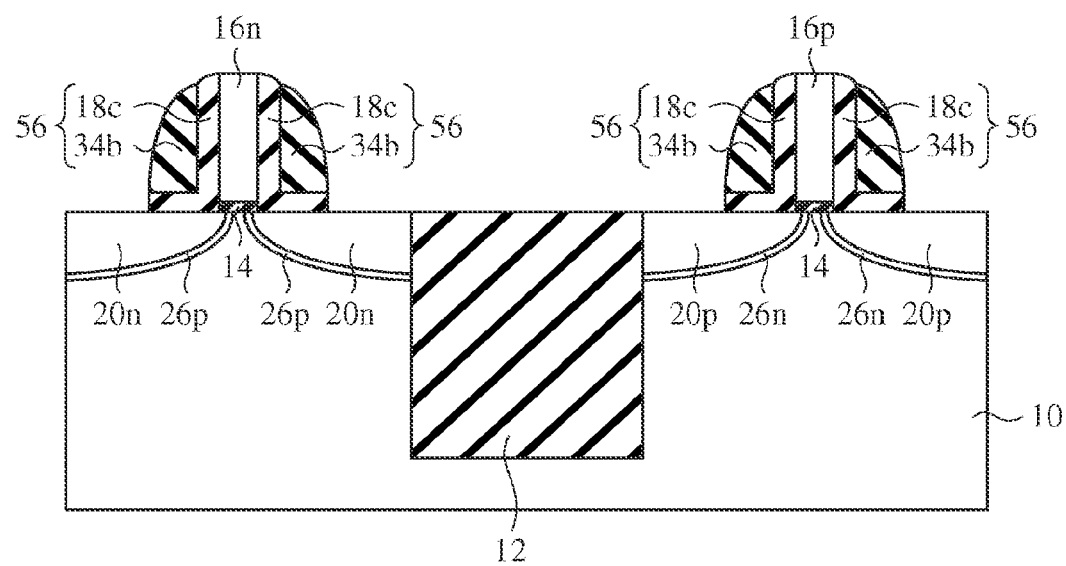

Next, by dry etching, e.g., RIE or others, the silicon nitride film 34 and the silicon oxide film 18 are anisotropically etched. Thus, on the side walls of the gate electrodes 16n, 16p, the sidewall insulating films 56 of the layer structure of the silicon oxide film 18c and the silicon nitride film 34b are formed (FIG. 12B).

Then, by photolithography, a photoresist film 58 covering the PMOS transistor forming region and exposing the NMOS transistor forming region is formed.

Figure 13A:
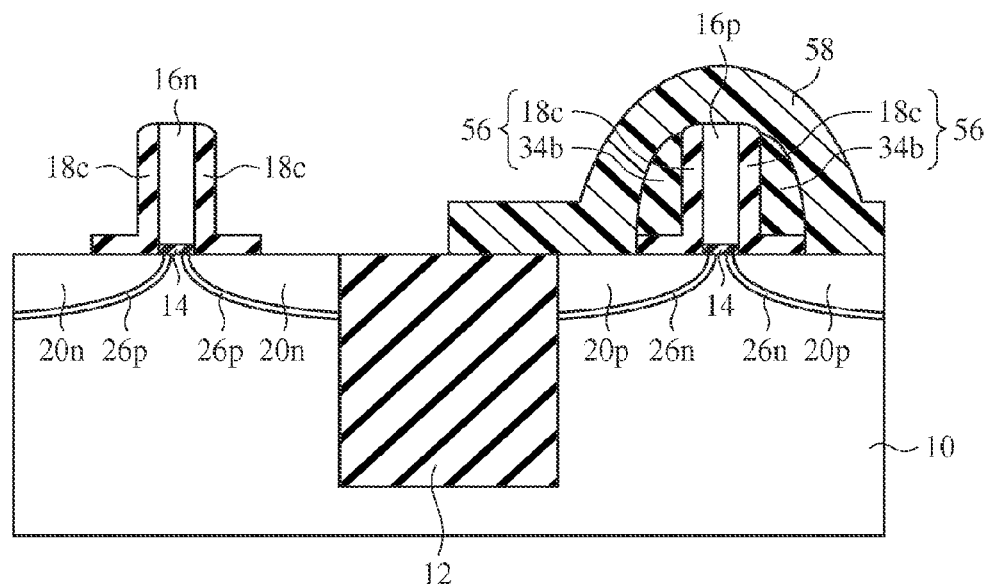

Then, wet etching is made with the photoresist film 58 as the mask, the silicon nitride film 34b in the NMOS transistor forming region is removed selectively to the silicon oxide film 18c (FIG. 13A).

Then, the photoresist film 58 is removed.

Figure 13B:
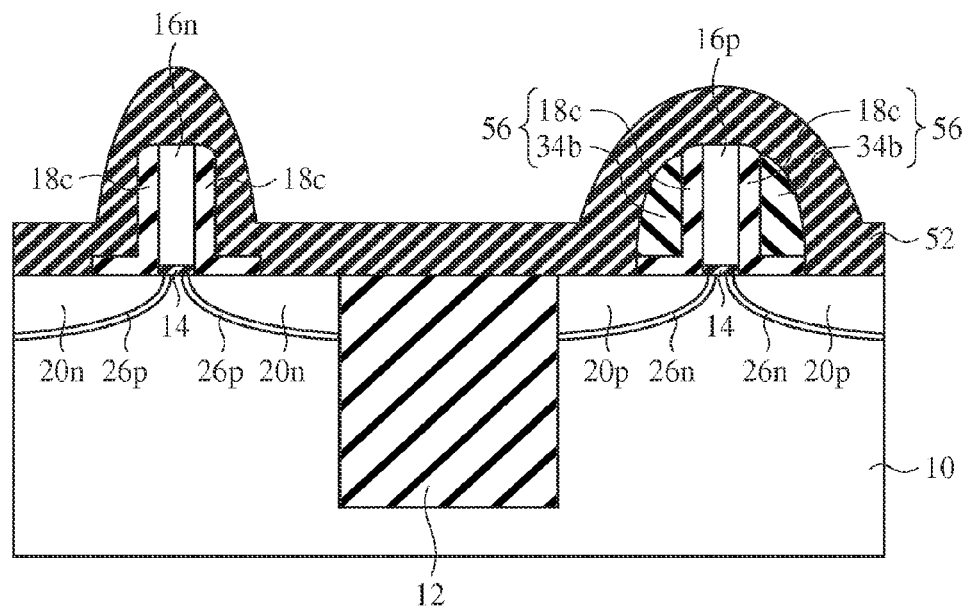

Next, over the entire surface by, e.g., CVD method, the silicon oxynitride film 52 of a 40 nm-thickness, for example, whose Young's modulus is equal to or smaller than the Young's modulus of silicon is deposited (FIG. 13B).

Figure 14A:
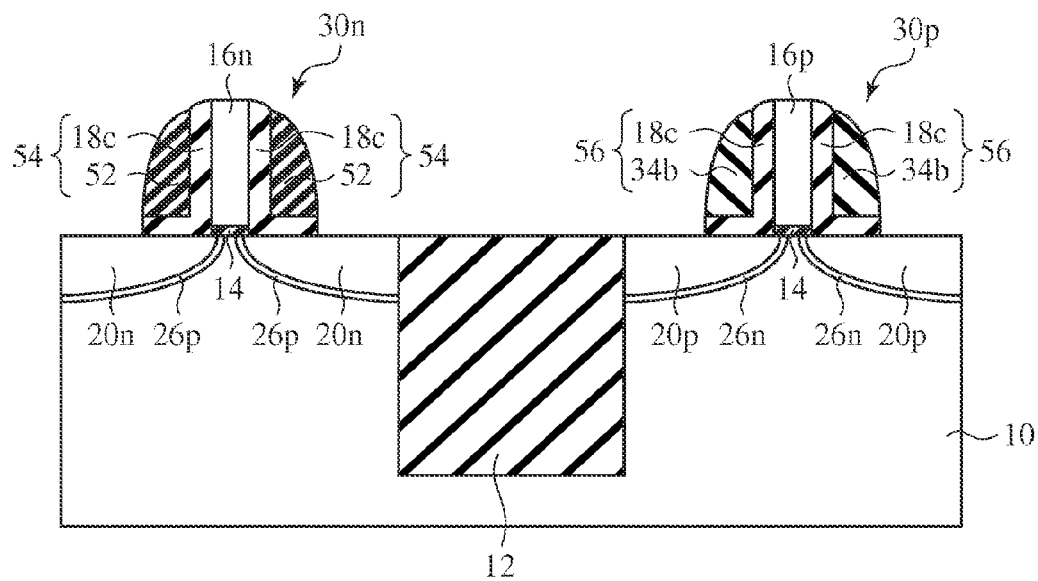

Then, by dry etching, e.g., RIE or others, the silicon oxynitride film 52 is anisotropically etched. Thus, in the NMOS transistor forming region, the sidewall insulating film 54 of the layer structure of the silicon oxide film 18c and the silicon oxynitride film 52 is formed on the side wall of the gate electrode 16n. On the other hand, in the PMOS transistor forming region, the silicon oxynitride film 52 is removed, and the sidewall insulating film 56 of the layer structure of the silicon oxide film 18c and the silicon nitride film 34b is exposed (FIG. 14A).

As described above, according to the present embodiment, the silicon nitride film 34b in the NMOS transistor forming region is removed, then the silicon oxynitride film 52 is formed, and the silicon oxynitride film 52 is anisotropically etched to thereby form the sidewall insulating film 54, 56 which are different from each other in the structure between the NMOS transistor and the PMOS transistor. Accordingly the manufacturing steps are not complicated, and the increase of the manufacturing step number can be suppressed.

Then, in the same way as in the method of manufacturing the semiconductor device according to the first embodiment, ion implantation is made with the gate electrode 16n and the sidewall insulating film 54 as the mask, the n-type impurity diffused regions 22n are formed in the NMOS transistor forming region. Ion implantation is made with the gate electrode 16p and the sidewall insulating film 56 as the mask, the p-type impurity diffused regions 22p are formed in the PMOS transistor forming region.

Figure 14B:
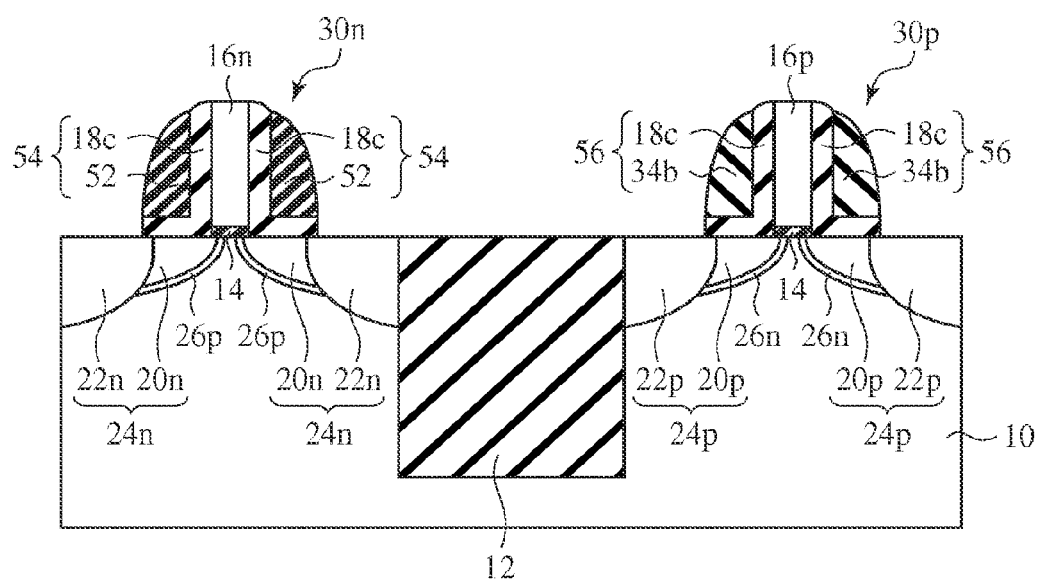

Then, prescribed thermal processing is made to activate the implanted impurities. Thus, in the NMOS transistor forming region, the n-type source/drain regions 24n of the extension source/drain structure of the n-type impurity diffused regions 20n, 22n are formed. In the PMOS transistor forming region, the p-type source/drain regions 24p of the extension source/drain structure of the p-type impurity diffused regions 20p, 22p are formed (FIG. 14B).

Hereafter, in the same way as in the method of manufacturing the semiconductor device according to the first embodiment illustrated in FIGS. 8B to 10B, the metal silicide films 28, the compressive stressor film 38 and the tensile stressor film 32 are formed.

Thus, the semiconductor device according to the present embodiment illustrated in FIG. 11 is manufactured.

As described above, according to the present embodiment, in the NMOS transistor 30n covered with the tensile stressor film 32, the sidewall insulating film 54, which has the layer structure of the silicon oxide film 18c and the silicon oxynitride film 52 and whose Young's modulus is smaller than the Young's modulus of silicon, is formed, and in the PMOS transistor 30p covered with the compressive stressor film 38, the sidewall insulating film 56, which has the layer structure of the silicon oxide film 18c and the silicon nitride film 34b and whose Young's modulus is larger than the Young's modulus of silicon and is larger than the Young's modulus of the sidewall insulating film 54, is formed, whereby the increase of the manufacturing steps can be suppressed while the characteristics of both the NMOS transistor 30n and the PMOS transistor 30p can be improved. Thus, according to the present embodiment, the characteristics of the semiconductor device of the CMOS structure can be improved.

A Third Embodiment

A semiconductor device and a method of manufacturing the same according to a third embodiment will be explained with reference to FIG. 15 to FIG. 18B.

Figure 15:
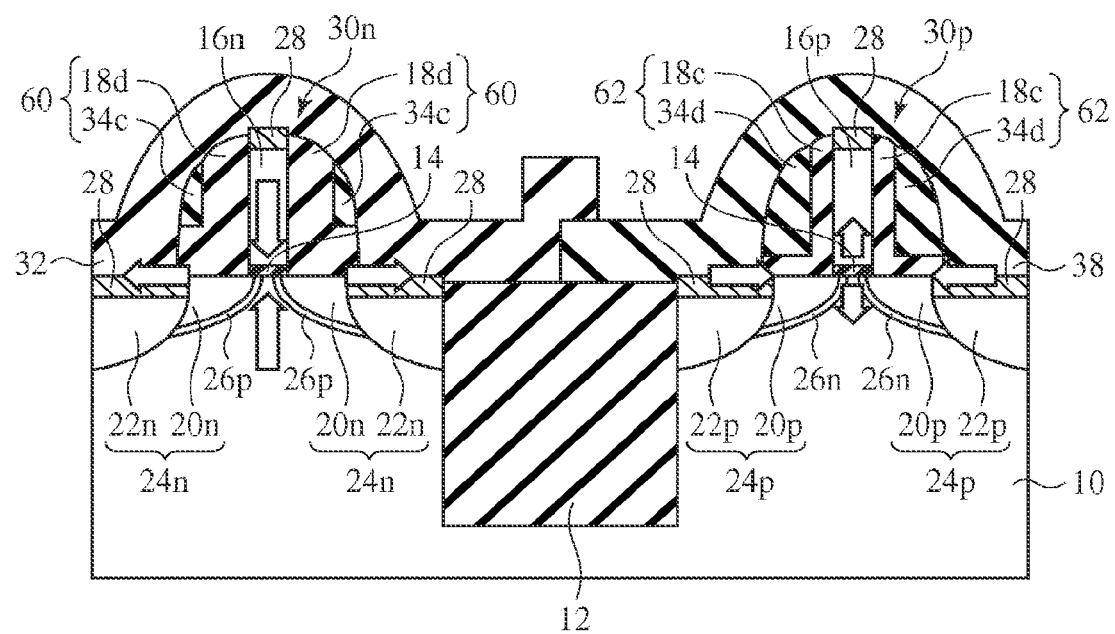
FIG. 15 is a diagrammatic sectional view illustrating a structure of the semiconductor device according to a third embodiment.

FIG. 15 is a diagrammatic sectional view illustrating the structure of the semiconductor device according to the present embodiment. FIGS. 16A to 18B are sectional views illustrating the method of manufacturing the semiconductor device according to the present embodiment. The same members of the present embodiment as those of the semiconductor device and method of manufacturing the same according to the first and the second embodiments are represented by the same reference numbers not to repeat or to simplify their explanation.

First, the structure of the semiconductor device according to the present embodiment will be explained with reference to FIG. 15.

In the semiconductor device according to the present embodiment, as illustrated, a sidewall insulating film 60 of the layer structure of a silicon oxide film 18d, whose Young's modulus is smaller than the Young's modulus of silicon, and a silicon nitride film 34c, whose Young's modulus is larger than the Young's modulus of silicon, is formed on the side wall of the gate electrode 16n of the NMOS transistor covered with the tensile stressor film 32.

A side wall insulating film 62 of the layer structure of a silicon oxide film 18d, whose Young's modulus is smaller than the Young's modulus of silicon, and a silicon nitride film 34d, which is thicker than the silicon nitride film 34c and whose Young's modulus is larger than the Young's modulus of silicon, is formed on the side wall of the gate electrode 16p of a PMOS transistor 30p covered with a compressive stress or film 38.

The ratio of the silicon nitride film 34d of the sidewall insulating film 62 is larger than the ratio of the silicon nitride film 34c of the sidewall insulating film 60. Accordingly, the average Young's modulus of the sidewall insulating film 62 is larger than the average Young's modulus of the sidewall insulating film 60. The average Young's modulus of the sidewall insulating film 60, whose silicon nitride film 34c ratio is relatively small, is smaller than the Young's modulus of silicon. The average Young's modulus of the sidewall insulating film 62, whose silicon nitride film 34d ratio is relatively large, is larger than the Young's modulus of silicon.

As described above, in the semiconductor device according to the present embodiment, in the NMOS transistor 30n covered with the tensile stressor film 32, the sidewall insulating film 60 of the layer structure of the silicon oxide film 18d and the silicon nitride film 34c is formed, and in the PMOS transistor covered with the compressive stressor film 38, the sidewall insulating film 62 is formed of the silicon oxide film 18e and the silicon nitride film 34d, the sidewall insulating film 62 has a larger ratio of the silicon nitride film than the sidewall insulating film 60, and the average Young's modulus of the sidewall insulating film 62 is larger than the average Young's modulus of the sidewall insulating film 60.

The sidewall insulating films 60, 62 are thus formed, whereby in the semiconductor device according to the present embodiment, in the NMOS transistor 30n, the average Young's modulus is smaller than the Young's modulus of silicon, and in the PMOS transistor 30p, the average Young's modulus of the sidewall insulating film 62 is larger than the Young's modulus of silicon and larger than the average Young's modulus of the sidewall insulating film 60.

Thus, in the semiconductor device according to the present embodiment as well in the semiconductor device according to the first embodiment, in the NMOS transistor 30n, the compressive stress perpendicular to the channel plane in the channel region is set equal to or more than the tensile stress in the channel length direction, whereby the carrier mobility of the NMOS transistor 30n can be increased.

In the PMOS transistor 30p, in the channel region, the compressive stress in the channel length direction is set larger than the tensile stress perpendicular to the channel plane, whereby the carrier mobility of the PMOS transistor 30p can be increased.

Thus, according to the present embodiment, in both the NMOS transistor 30n and the PMOS transistor 30p, the drive current can be increased, and the characteristics can be improved. Thus, according to the present embodiment, the characteristics of the semiconductor device of the CMOS structure can be improved.

Next, the method of manufacturing the semiconductor device according to the present embodiment will be explained with reference to FIGS. 16A to 18B.

First, in the same way as in the method of manufacturing the semiconductor device according to the first embodiment illustrated in FIGS. 5A to 5B, the semiconductor device is formed up to the impurity diffused regions 20n, 20p.

Figure 16A:
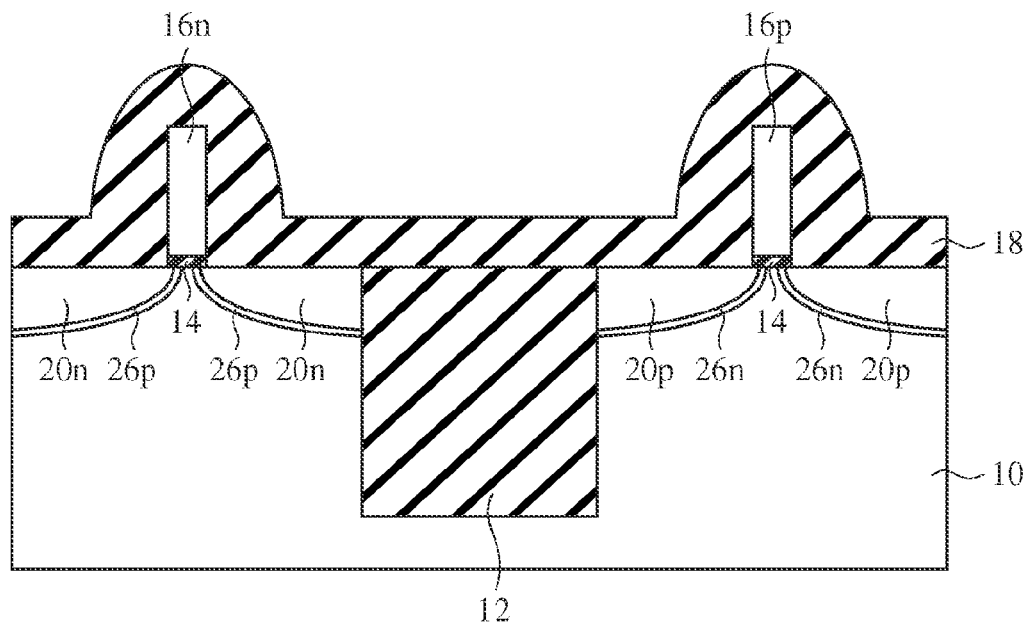
FIGS. 16A-16B, 17A-17B and 18A-18B are sectional views illustrating a method of manufacturing the semiconductor device according to the third embodiment.

Next, over the entire surface, a silicon oxide film 18 of a 40 nm-thickness, for example, is deposited by, e.g., CVD method (FIG. 16A).

Next, by photolithography, a photoresist film 64 covering the NMOS transistor forming region and exposing the PMOS transistor forming region is formed.

Figure 16B:
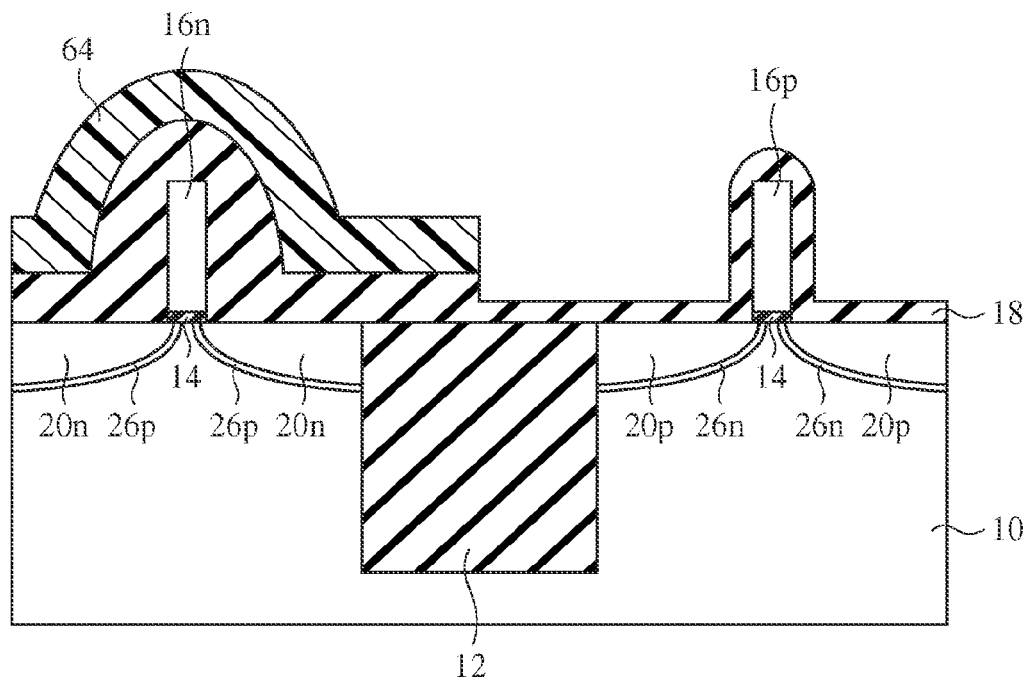

Next, with the photoresist film 64 as the mask, wet etching is made with, e.g., a hydrofluoric acid-based aqueous solution to thin the silicon oxide film 18 in the PMOS transistor forming region to, e.g., about 15 nm (FIG. 16B). Thus, the silicon oxide film 18 in the PMOS transistor forming region is made thinner than the silicon oxide film 18 in the NMOS transistor forming region.

Then, the photoresist film 64 is removed.

Figure 17A:
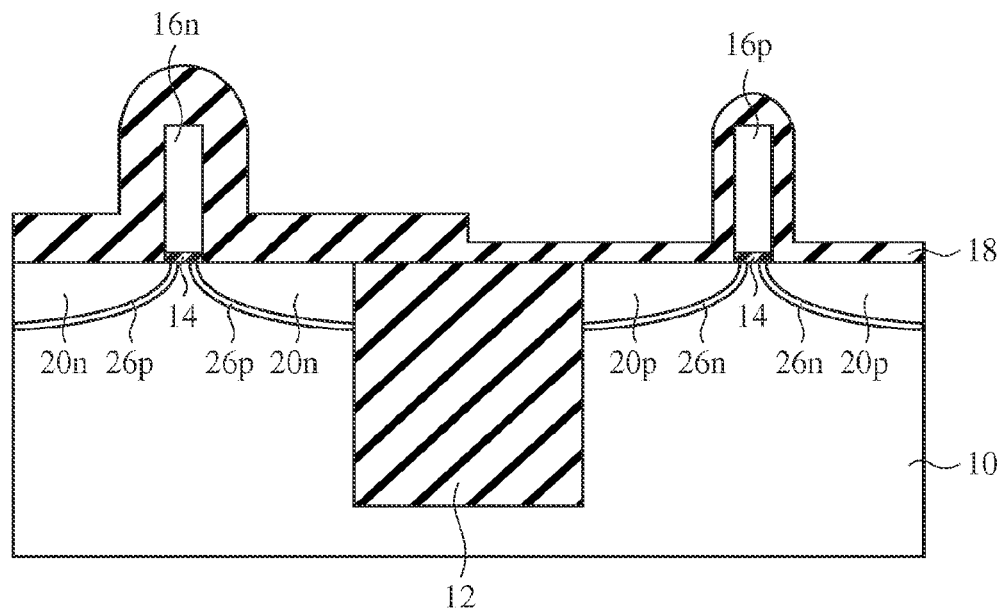

Then, by wet etching with, e.g., a hydrofluoric acid-based aqueous solution is made on the silicon oxide film 18 in the NMOS transistor forming region and the PMOS transistor forming region. Thus, the silicon oxide film 18 in the NMOS transistor forming region and in the PMOS transistor forming region is thinned respectively to, e.g., about 30 nm and, e.g., about 5 nm (FIG. 17A).

Figure 17B:
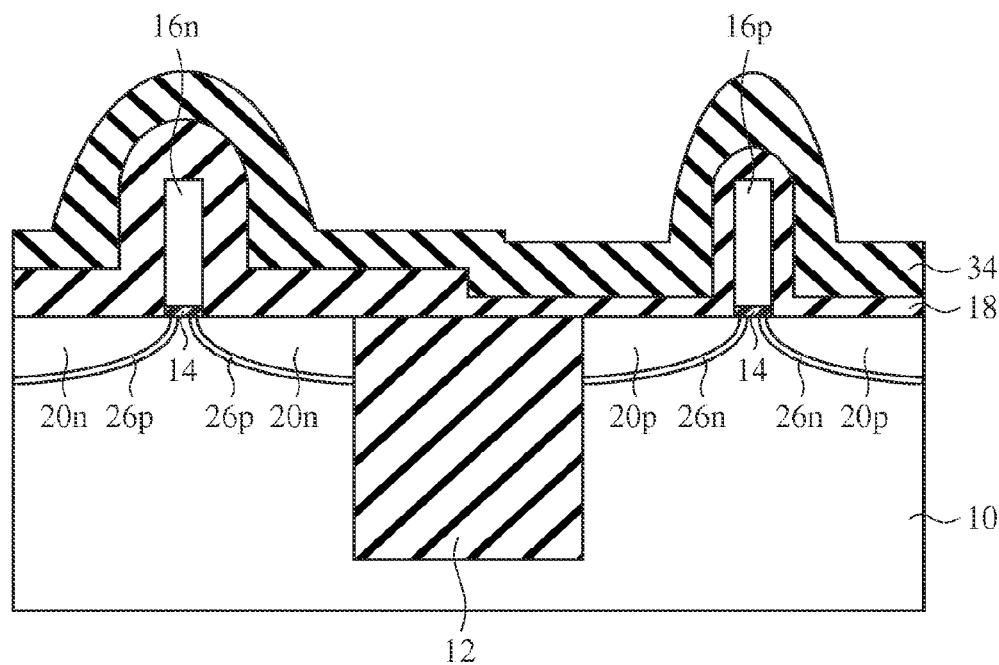

Next, on the silicon oxide film 18, a silicon nitride film 34 of a 40 nm-thickness, for example, is deposited by, e.g., plasma CVD method (FIG. 17B).

Next, by dry etching, e.g., RIE or others, the silicon nitride film 34 and the silicon oxide film 18 are anisotropically etched. Thus, in the NMOS transistor forming region, the sidewall insulating film 60 of the layer structure of the relatively thick silicon oxide film 18d and the relatively thin silicon nitride film 34c is formed on the side wall of the gate electrode 16n. On the other hand, in the PMOS transistor forming region, the sidewall insulating film 62 of the layer structure of the relatively thin silicon oxide film 18e and the relatively thick silicon nitride film 34d is formed on the side wall of the gate electrode 16p. The ratio of the silicon nitride film 34d of the sidewall insulating film 62 is larger than the ratio of the silicon nitride film 34c of the sidewall insulating film 60.

As described above, in the present embodiment, the silicon oxide film 18 in the PMOS transistor forming region is thinned by wet etching than the silicon oxide film 18 in the NMOS transistor forming region to thereby form the sidewall insulating films 60, 62, which are different between the NMOS transistor and the PMOS transistor in the ratio of the silicon nitride film. Thus, the manufacturing steps are not complicated, and the increase of the manufacturing step number can be suppressed.

Then, in the same way as in the method of manufacturing the semiconductor device according to the first embodiment, ion implantation is made with the gate electrode 16n and the sidewall insulating film 60 as the mask to form the n-type impurity diffused regions 22n in the NMOS transistor forming region. Ion implantation is made with the gate electrode 16p and the sidewall insulating film 62 as the mask to form the p-type impurity diffused regions 22p in the PMOS transistor forming region.

Then, prescribed thermal processing is made to activate the implanted impurities. Thus, in the NMOS transistor forming region, the n-type source/drain regions 24n of the extension source/drain structure formed of the n-type impurity diffused regions 20n, 22n are formed. In the PMOS transistor forming region, the p-type source/drain regions 24p of the extension source/drain structure formed of the p-type impurity diffused regions 20p, 22p are formed (FIG. 18B).

Hereafter, in the same way as in the method of manufacturing the semiconductor device according to the first embodiment illustrated in FIGS. 8B to 10B, the metal silicide films 28, the compressive stressor film 38 and the tensile stressor film 32 are formed.

Thus, the semiconductor device according to the present embodiment illustrated in FIG. 15 is manufactured.

As described above, according to the present embodiment, in the NMOS transistor 30n covered with the tensile stressor film 32, the sidewall insulating film 60 whose ratio of the silicon nitride film 34c is relatively small and whose Young' modulus is smaller than the Young's modulus of silicon is formed, and in the PMOS transistor 30p covered with the compressive stressor film 38, the sidewall insulating film 62 whose ratio of the silicon nitride film 34d is relatively large and whose Young's modulus is larger than the Young's modulus of silicon and larger than the sidewall insulating film 60 is formed, whereby the increase of the manufacturing steps can be suppressed while the characteristics of both the NMOS transistor 30n and the PMOS transistor 30p can be improved.

Thus, according to the present embodiment, the characteristics of the semiconductor device of the CMOS structure can be improved.

A Fourth Embodiment

A semiconductor device and a method of manufacturing the same according to a fourth embodiment will be explained with reference to FIGS. 19 to 20B.

Figure 19:
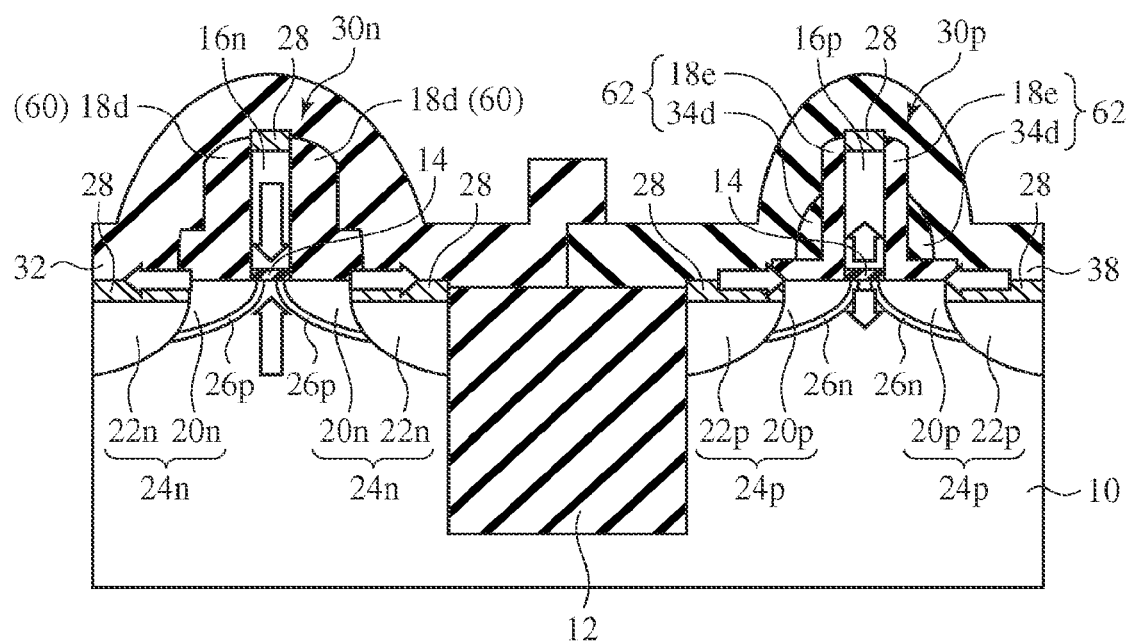
FIG. 19 is a diagrammatic sectional view illustrating a structure of the semiconductor device according to a fourth embodiment.
Figure 20A:
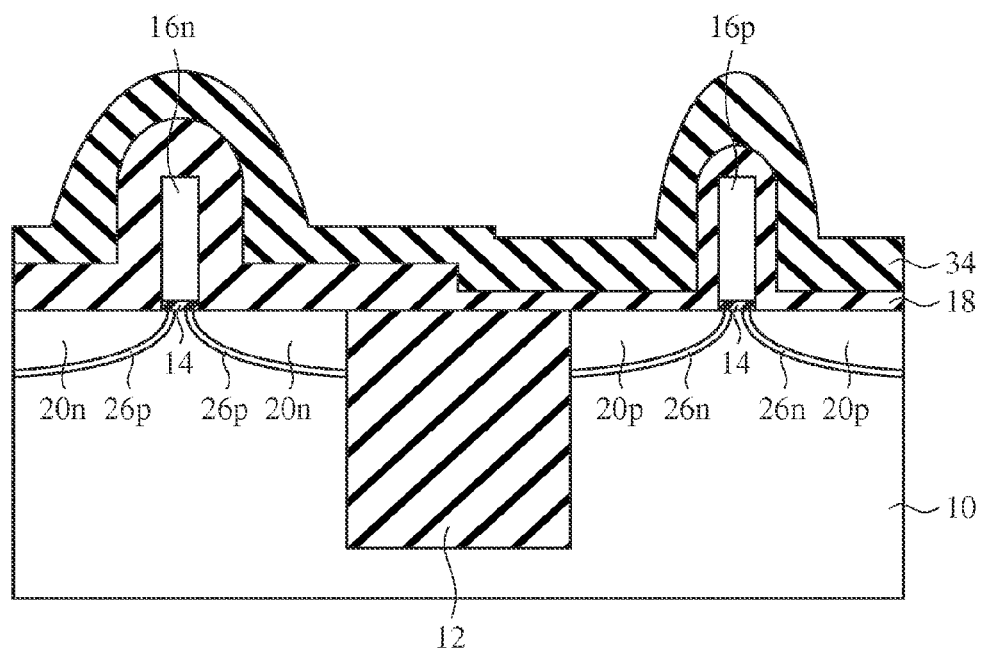
FIGS. 20A-20B are sectional views illustrating a method of manufacturing the semiconductor device according to the fourth embodiment.
Figure 20B:
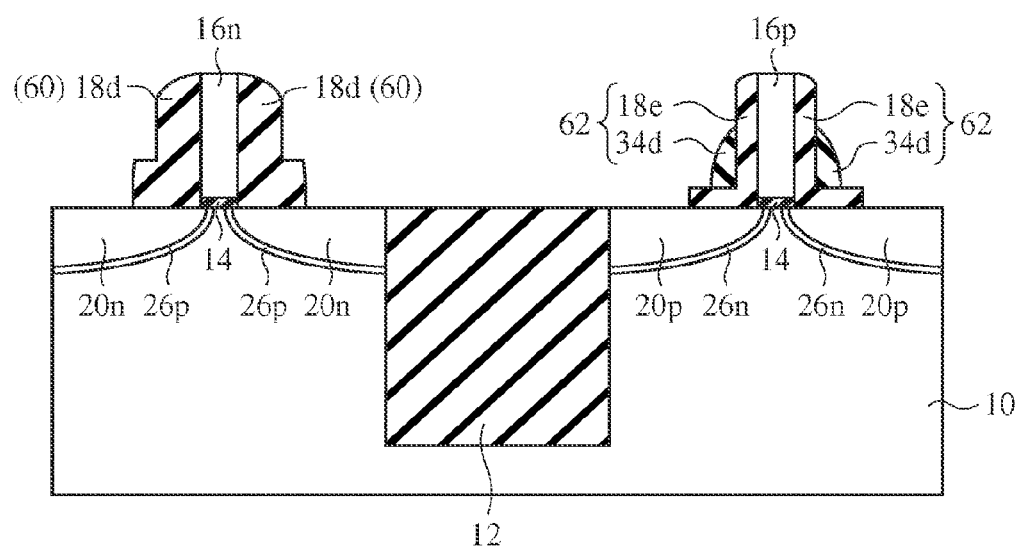

FIG. 19 is a diagrammatic sectional view illustrating the structure of the semiconductor device according to the present embodiment. FIGS. 20A and 20B are sectional views illustrating the method of manufacturing the semiconductor device according to the present embodiment. The same members of the present embodiment as those of the semiconductor device and the method of manufacturing the same according to the first to the third embodiments are represented by the same reference numbers not to repeat or to simplify their explanation.

In the third embodiment, in the NMOS transistor 30n, the sidewall insulating film 60 of the layer structure of the silicon oxide film 18d and the silicon nitride film 34c is formed. However, the silicon nitride film 34c may be removed by dry etching for forming the sidewall insulating films 60, 62.

In the present embodiment, the semiconductor device according to the third embodiment having the silicon nitride film 34c removed will be explained.

First, the structure of the semiconductor device according to the present embodiment will be explained with reference to FIG. 19.

In the semiconductor device according to the present embodiment, as illustrated, the sidewall insulating film 60 of the silicon oxide film 16d whose Young's modulus is smaller than the Young's modulus of silicon is formed on the side wall of the gate electrode 16n of the NMOS transistor 30n. In the present embodiment, the semiconductor device according to the third embodiment has the silicon nitride film 34c removed.

As in the semiconductor device according to the third embodiment, the sidewall insulating film 62 of the layer structure of a silicon oxide film 18e and the silicon nitride film 34d is formed on the side wall of the gate electrode 16p of the PMOS transistor 30p. The silicon nitride film 34d is relatively thinner than the silicon nitride film 34d of the semiconductor device according to the third embodiment.

As described above, in the semiconductor device according to the third embodiment, the silicon nitride film 34c forming the sidewall insulating film 60 of the NMOS transistor 30n may be removed.

Figure 18A:
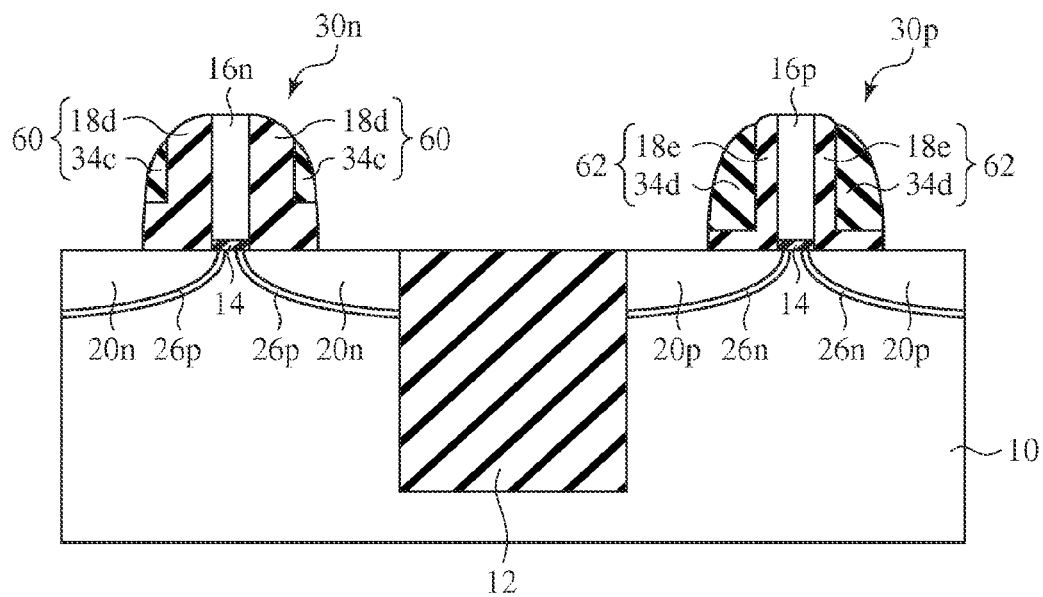
Figure 18B:
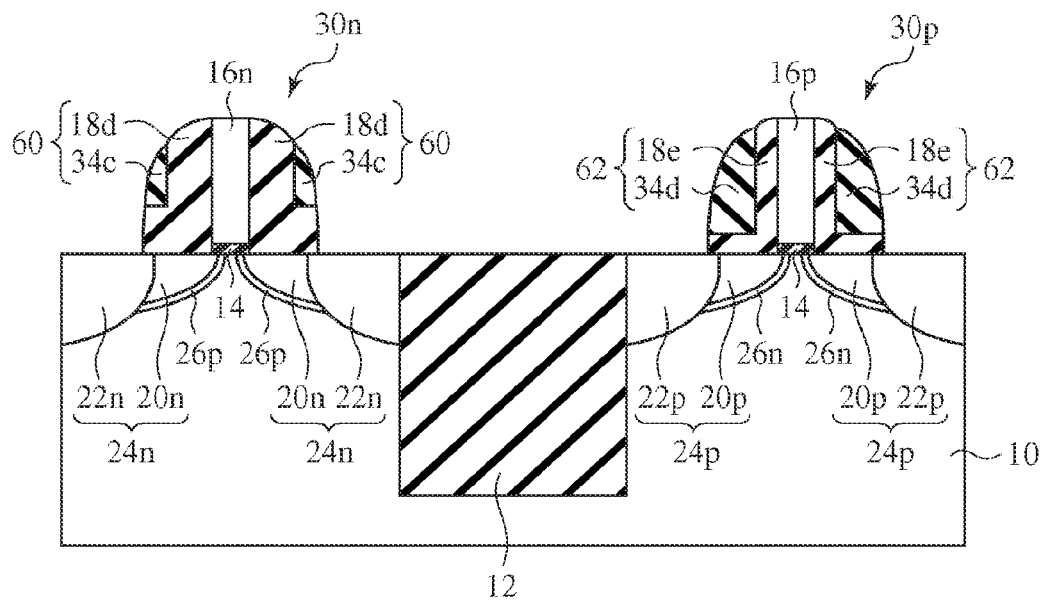

Next, the method of manufacturing the semiconductor device according to the present embodiment will be explained with reference to FIGS. 20A-20B.

the semiconductor device according to the present embodiment can be manufactured by increasing the etching quantity of the silicon nitride film 34 in the dry etching for forming the sidewall insulating films 60, 62 in the third embodiment (see FIG. 18A).

First, in the same way as in the method of manufacturing the semiconductor device according to the third embodiment illustrated in FIG. 16A to FIG. 17B, the semiconductor device is formed up to the silicon nitride film 34 (FIG. 20A).

Then, the silicon nitride film 34 and the silicon oxide film 18 are anisotropically etched by dry etching, e.g., RIE or others. At this time, the etch quantity of the silicon nitride film 34 is made larger by, e.g., 50% than in the third embodiment, whereby the silicon nitride film 34 in the NMOS transistor forming region is removed. Thus, in the NMOS transistor forming region, the sidewall insulating film 60 of the thick silicon oxide film 18d is formed on the side wall of the gate electrode 16n. The silicon nitride film 34 does not remain and is removed. On the other hand, in the PMOS transistor forming region, the sidewall insulating film 62 of the layer structure of the relatively thin silicon oxide film 18e and the relatively thick silicon nitride film 34d is formed on the side wall of the gate electrode 16p (FIG. 20B). The silicon nitride film 34d is thinner than the silicon nitride film 34d of the semiconductor device according to the third embodiment.

The following steps are the same as those of the method of manufacturing the semiconductor device according to the third embodiment and, their explanation will not be repeated.

A Fifth Embodiment

A semiconductor device and a method of manufacturing the same according to a fifth embodiment will be explained with reference to FIGS. 21 to 23B.

Figure 21:
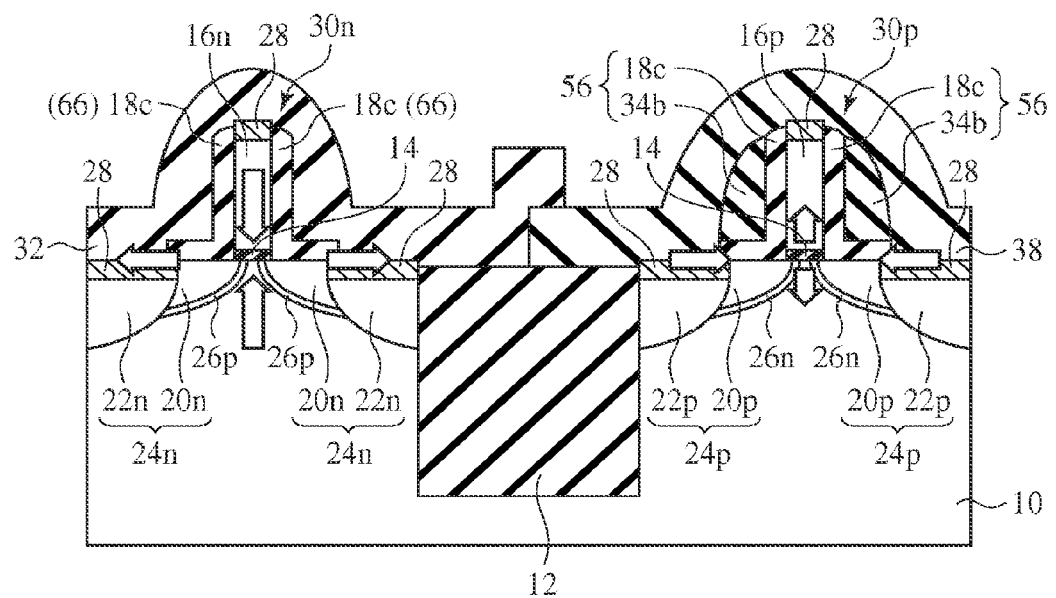
FIG. 21 is a diagrammatic sectional view illustrating a structure of the semiconductor device according to a fifth embodiment.

FIG. 21 is a diagrammatic sectional view illustrating the structure of the semiconductor device according to the present embodiment. FIGS. 22A to 23B are sectional views illustrating the method of manufacturing the semiconductor device according to the present embodiment. The same members of the present embodiment as those of the semiconductor device and the method of manufacturing the same according to the first to the fourth embodiments are represented by the same reference numbers not to repeat or to simplify their explanation.

First, the structure of the semiconductor device according to the present embodiment will be explained with reference to FIG. 21.

In the semiconductor device according to the present embodiment, as illustrated, a side wall insulating film 66 of a silicon oxide film 18c whose Young's modulus is smaller than the Young's modulus of silicon is formed on the side wall of the gate electrode 16n of the NMOS transistor 30n covered with the tensile stressor film 32.

On the side wall of the gate electrode 16p of a PMOS transistor covered with a tensile stressor film 38, as in the semiconductor device according to the second embodiment, the sidewall insulating film 56 of the layer structure of the silicon oxide film 18c, whose Young's modulus is smaller than the Young's modulus of silicon, and the silicon nitride film 34b, whose Young's modulus is larger than the Young's modulus of silicon, is formed. The film thickness of the silicon oxide film 18c forming the sidewall insulating film 56 is substantially equal to the film thickness of the silicon oxide film 18c, that is the sidewall insulating film 66.

As described above, in the semiconductor device according to the present embodiment, in the NMOS transistor 30n covered with the tensile stressor film 32, the sidewall insulating film 66 of the silicon oxide film 18c, whose Young's modulus is smaller than the Young's modulus of silicon, is formed, and in the PMOS transistor 30p covered with the compressive stressor film 38, the sidewall insulating film 56 of the layer structure of the silicon oxide film 18c, whose Young's modulus is smaller than the Young's modulus of silicon, and the silicon nitride film 34b, whose Young's modulus is larger than the Young's modulus of silicon, is formed.

In the semiconductor device according to the present embodiment, the sidewall insulating films 66, 56 are thus formed, whereby in the NMOS transistor 30n covered with the tensile stressor film 32, the Young's modulus of the sidewall insulating film 66 is larger than the Young's modulus of silicon, and in the PMOS transistor 30p covered with the compressive stressor film 38, the average Young's modulus of the sidewall insulating film 56 is larger than the Young's modulus of silicon and larger than the Young's modulus of the sidewall insulating film 66.

Thus, in the semiconductor device according to the present embodiment as well as in the semiconductor device according to the first embodiment, in the NMSO transistor 30*n*, in the channel region, the compressive stress perpendicular to the channel plane is set equal or more than the tensile stress in the channel length direction. Thus, the carrier mobility in the NMOS transistor 30*n* can be improved.

In the PMOS transistor 30*p*, in the channel region, the compressive stress in the channel length direction is set larger than the tensile stress perpendicular to the channel plane. Thus, the carrier mobility of the PMOS transistor 30*p* can be improved.

Thus, according to the present embodiment, in both the NMOS transistor 30*n* and the PMOS transistor 30*p*, the drive current can be increased, and the characteristics can be improved. Thus, according to the present embodiment the characteristics of the semiconductor of the MOS structure can be improved.

Next, the method of manufacturing the semiconductor device according to the present embodiment will be explained with reference to FIGS. 22A to 23B.

Figure 22A:
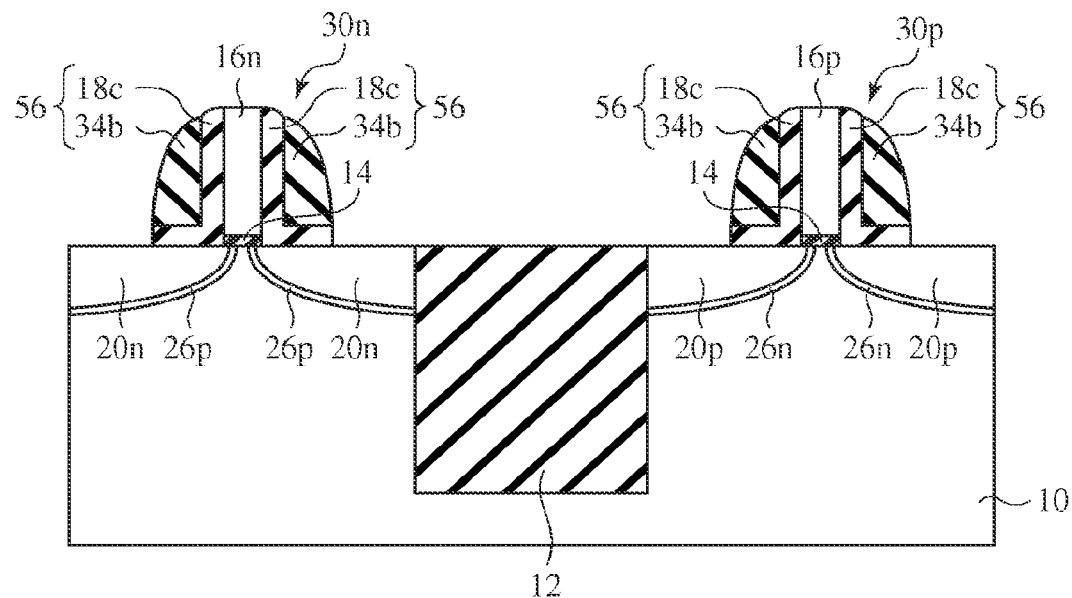
FIGS. 22A-22B and 23A-23B are sectional views illustrating a method of manufacturing the semiconductor device according to the fifth embodiment.

First, in the same way as in the method of manufacturing the semiconductor device according to the second embodiment illustrated in FIGS. 12A to 12B, the sidewall insulating films 56 of the layer structure of the silicon oxide film 18*c* and the silicon nitride film 34*b* are formed on the side walls of the gate electrodes 16*n*, 16*p* (FIG. 22A).

Next, by photolithography, a photoresist film 68 covering the PMOS transistor forming region and exposing the NMOS transistor forming region is formed.

Figure 22B:
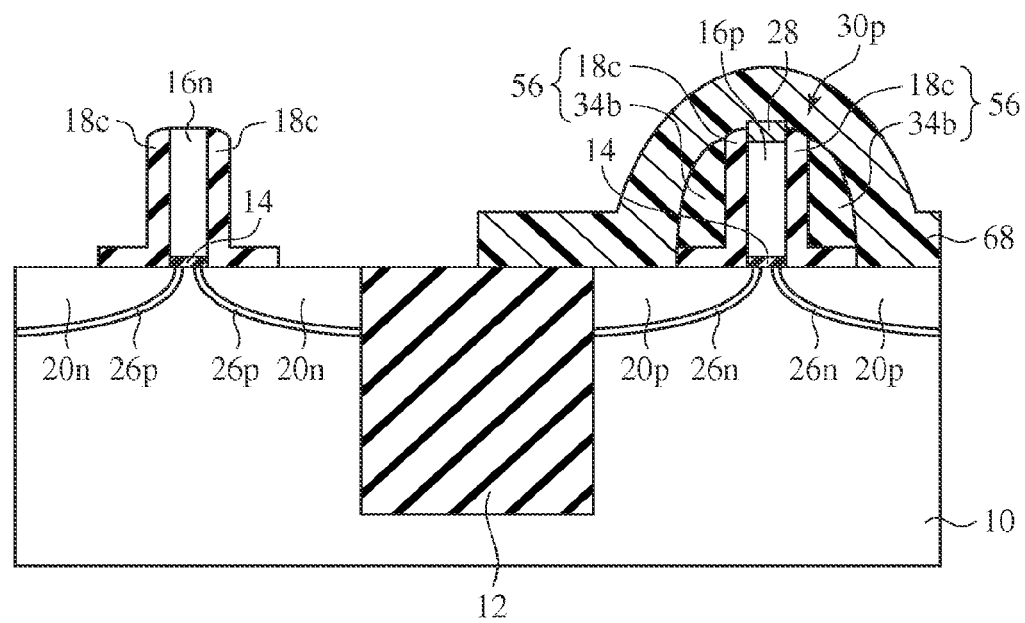

Next, by wet etching with the photoresist film 68 as the mask, the silicon nitride film 34*b* in the NMOS transistor forming region is removed selectively to the silicon oxide film 18*c* (FIG. 22B).

Next, the photoresist film 58 is removed.

Figure 23A:
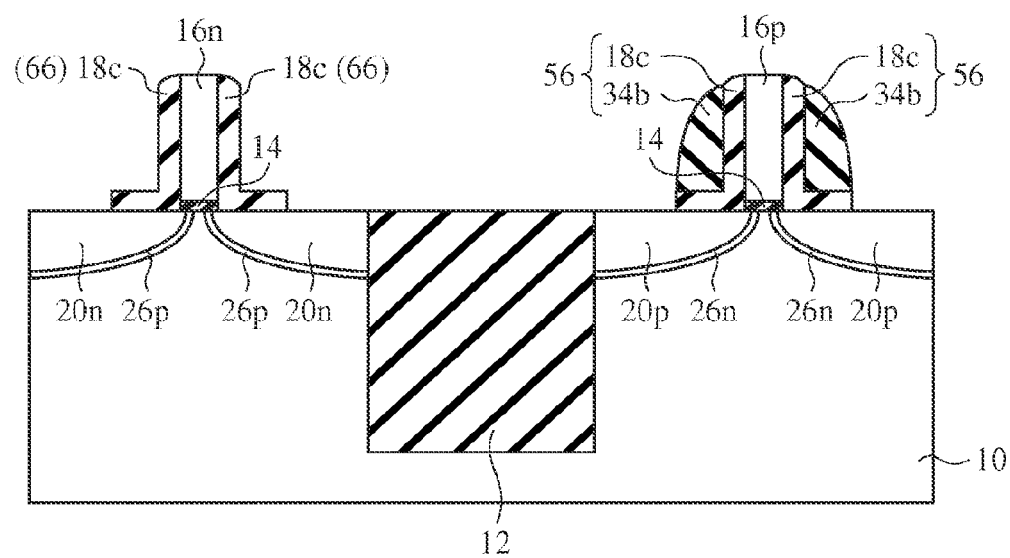

Thus, in the NMOS transistor forming region, the sidewall insulating film 66 of the relatively thin silicon oxide film 18*c* is formed on the side wall of the gate electrode 16*n*. On the other hand, in the PMOS transistor forming region, the sidewall insulating film 56 of the layer structure of the silicon oxide film 18*c*, whose film thickness is substantially equal to the silicon oxide film 18*c* of the sidewall insulating film 66, and the silicon nitride film 34*c* is formed on the side wall of the gate electrode 16*p* (FIG. 23A).

As described above, in the present embodiment, the silicon nitride film 34*b* in the NMOS transistor-to-be-formed region by wet etching to thereby form the sidewall insulating films 66, 56 which are different in the structure between the NMOS transistor and the PMOS transistor. Accordingly, the manufacturing steps are not complicated, and the increase of the manufacturing step number can be suppressed.

In the same way as in the method of manufacturing the semiconductor device according to the first embodiment, ion implantation is made with the gate electrode 16*n* and the sidewall insulating film 66 as the mask to form the n-type impurity diffused regions 22*n* in the NMOS transistor forming region. Ion implantation is made with the gate electrode 16*p* and the sidewall insulating film 56 as the mask to form p-type impurity diffused regions 22*p* in the PMOS transistor forming region.

Figure 23B:
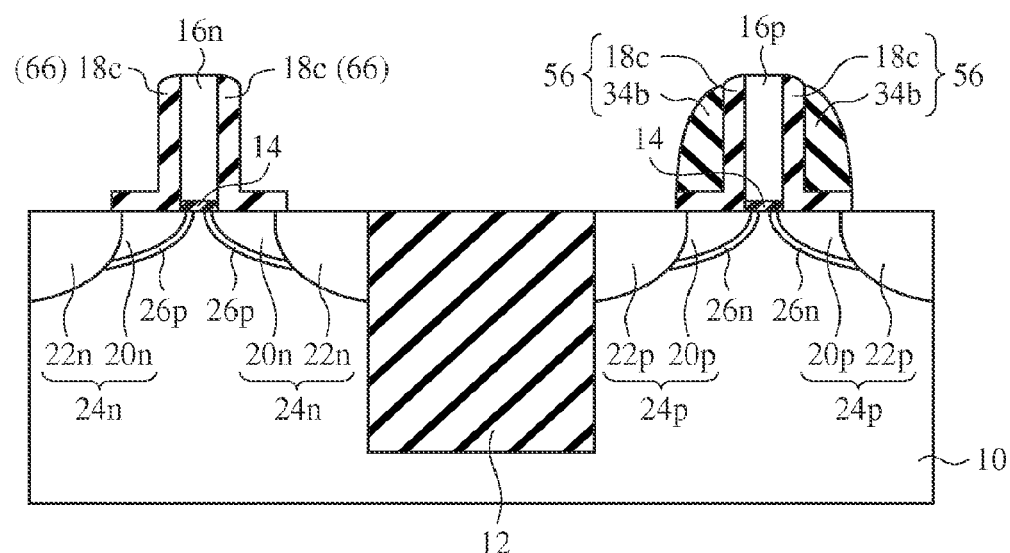
Figure 24:
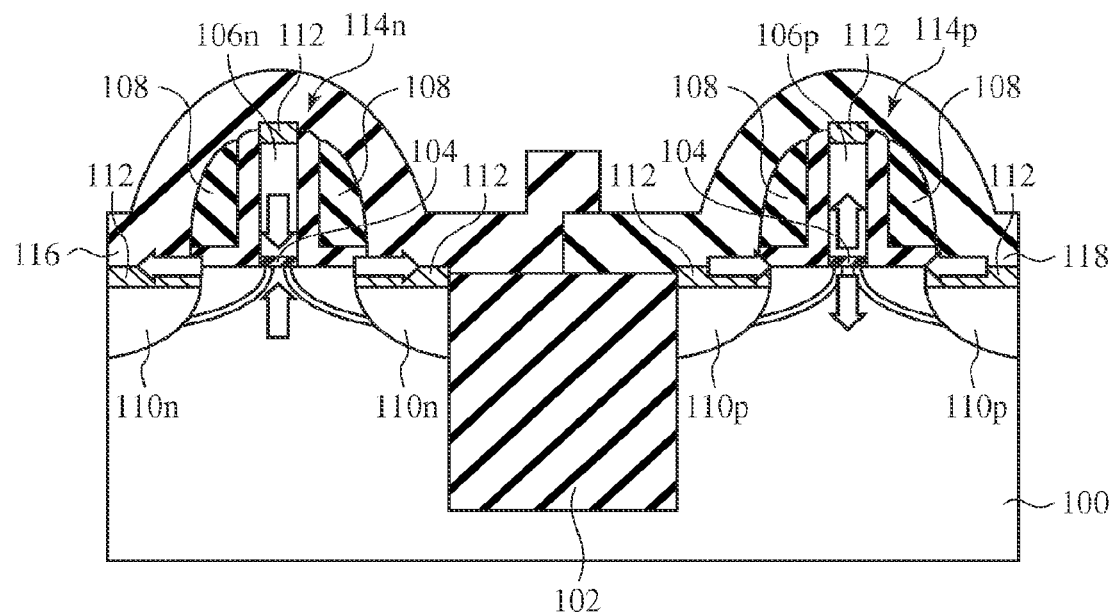
FIG. 24 is a diagrammatic sectional view illustrating a structure of the conventional semiconductor device of the CMOS structure having stresses introduced in the channel regions by the tensile stressor film and the compressive stressor film.

Then, prescribed thermal processing is made to activate the implanted impurities. Thus, the n-type source/drain regions 24*n* of the extension source/drain structure of the n-type impurity diffused regions 20*n*, 22*n* are formed. In the PMOS transistor forming region, the p-type source/drain regions 24*p* of the extension source/drain structure of the p-type impurity diffused regions 20*p*, 22*p* are formed (FIG. 23B).

Hereafter, in the same way as in the method of manufacturing the semiconductor device according to the first embodiment illustrated in FIGS. 8B to 10B, the metal silicide films 28, the compressive stressor film and the tensile stressor film 32 are formed.

Thus, the semiconductor device according to the present embodiment illustrated in FIG. 21 is manufactured.

As described above, according to the present embodiment, in the NMOS transistor 30*n* covered with the tensile stressor film 32, the sidewall insulating film 66 of the silicon oxide film 18*c*, whose Young's modulus is smaller than the Young's modulus of silicon is formed, and in the PMOS transistor 30*p* covered with the compressive stressor film 38, the sidewall insulating film 56 of the layer structure of the silicon oxide film 18*c* and the silicon nitride film 34*b*, whose Young's modulus is larger than the Young's modulus of silicon and is larger than the Young's modulus of the sidewall insulating film 66 is formed, whereby the increase of the manufacturing steps can be suppressed, and the characteristics of both the NMOS transistor 30*n* and the PMOS transistor 30*p* can be improved. Thus, according to the present embodiment, the characteristics of the semiconductor device of the CMOS structure can be improved.

Modified Embodiments

The above-described embodiments can cover other various modifications.

For example, in the above-described embodiments, the tensile stressor film 32 of silicon nitride film is formed over the NMOS transistor 30*n*, but the tensile stressor film 32 is not limited to silicon nitride film. As the tensile stressor film 32, various insulating film having tensile stress other than silicon nitride film can be formed.

In the above-described embodiments, the compressive stressor film 38 of silicon nitride film is formed over the PMOS transistor 30*p*. The compressive stressor film 38 is not limited to silicon nitride film. As the compressive stressor film 38, various insulating films having compressive stress other than silicon nitride film can be formed.

In the above-described embodiments, the sidewall insulating film of the NMOS transistor 30*n* includes silicon oxide film whose Young's modulus is smaller than the Young's modulus of silicon. However, in place of silicon oxide film, various insulating film having Young's moduli smaller than the Young's modulus of silicon can be formed.

In the above-described embodiments, the sidewall insulating film of the NMOS transistor 30*n* includes silicon oxynitride film whose Young's modulus is equal to or below the Young's modulus of silicon. However, in place of silicon oxynitride film, various insulating films having Young's moduli equal to or below the Young's modulus of silicon can be formed.

In the above-described embodiments, the sidewall insulating film of the PMOS transistor 30*p* includes silicon nitride film whose Young's modulus is larger than the Young's modulus of silicon. However, in place of silicon nitride film various insulating films having Young's moduli larger than the Young's modulus of silicon can be formed.

In the above-described embodiments, the sidewall insulating films 36, 56, 62 of the PMOS transistor 30*p* are formed of the layer structure of silicon oxide film and silicon nitride film. In place of the sidewall insulating films 36, 56, 62 of such layer structure, sidewall insulating films of the single layer structure of insulating films, such as silicon nitride film, etc., whose Young's moduli are larger than the Young's modulus of silicon may be formed.

In the above-described embodiments, the metal silicide films 28 are formed on the gate electrodes 16n, 16p and on the source/drain regions 24n, 24p. However, the metal silicide films 28 may not be formed.

In the above-described embodiments, the tensile stressor film 32 is formed after the compressive stressor film 38 has been formed. However, the priority of forming the tensile stressor film 32 and the compressive stressor film 38 is not limited to this. The compressive stressor film 38 may be formed after the tensile stressor film 32 has been formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device including an n-channel transistor formed in a first device region of a silicon substrate, and a p-channel transistor formed in a second device region of the silicon substrate, comprising:

forming a first gate electrode of the n-channel transistor over the first device region with a first gate insulating film formed therebetween, a second gate electrode of the p-channel transistor over the second device region with a second gate insulating film formed therebetween;

forming a first insulating film having a Young's modulus smaller than a Young's modulus of silicon over the silicon substrate with the first gate electrode and the second gate electrode formed on;

etching the first insulating film in the second device region to thereby make the first insulating film in the second device region thinner than the first insulating film in the first device region;

forming over the first insulating film a second insulating film having a Young's modulus larger than the Young's modulus of silicon;

etching the second insulating film and the first insulating film to thereby form a first sidewall insulating film on a side wall of the first gate electrode, and form a second sidewall insulating film on a side wall of the second gate electrode; and forming, covering the n-channel transistor, a tensile stressor film which applies to a channel region of the n-channel transistor a compressive stress perpendicular to a channel plane and a tensile stress in a channel length direction, and forming, covering the p-channel transistor, a compressive stressor film which applies to a channel region of the p-channel transistor a tensile stress perpendicular to a channel channel plane and a compressive stress in a channel length direction, wherein the first sidewall insulating film includes the first insulating film and has a Young's modulus smaller than the Young's modulus of silicon, and the second sidewall insulating film includes a layer structure of the first insulating film and the second insulating film and has a Young's modulus which is larger than the Young's modulus of silicon and is larger than the Young's modulus of the first sidewall insulating film.

2. The method of manufacturing a semiconductor device according to claim 1, wherein in forming the first sidewall insulating film and the second sidewall insulating film, the second insulating film in the first device region is removed, and the first sidewall insulating film of the first insulating film is formed.

3. The method of manufacturing a semiconductor device according to claim 1, wherein in forming the first sidewall insulating film and the second sidewall insulating film, the first sidewall insulating film of a layer structure of the first insulating film and the second insulating film is formed on the side wall of the first gate electrode, and the second sidewall insulating film having a layer structure of the first insulating film and the second insulating film and a ratio of the second insulating film larger than a ratio thereof in the first sidewall insulating film is formed on the side wall of the second gate electrode.

4. The method of manufacturing a semiconductor device according to claim 1, wherein the first insulating film is a silicon oxide film, and
   the second insulating film is a silicon nitride film.

5. A method of manufacturing a semiconductor device including an n-channel transistor formed in a first device region of a silicon substrate, and a p-channel transistor formed in a second device region of the silicon substrate, comprising:

forming a first gate electrode of the n-channel transistor over the first device region with a first gate insulating film formed therebetween, a second gate electrode of the p-channel transistor over the second device region with a second gate insulating film formed therebetween;

forming a first insulating film having a Young's modulus smaller than a Young's modulus of silicon over the silicon substrate with the first gate electrode and the second gate electrode;

forming a second insulating film having a Young's modulus larger than the Young's modulus of silicon over the first insulating film;

etching the second insulating film and the first insulating film to thereby form a first sidewall insulating film and a second sidewall insulating film which have a layer structure of the first insulating film and the second insulating film and have a Young's modulus larger than the Young's modulus of silicon respectively on a side wall of the first gate electrode and a side wall of the second gate electrode;

removing the second insulating film of the first sidewall insulating film; and forming, covering the n-channel transistor, a tensile stressor film which applies to a channel region of the n-channel transistor a compressive stress perpendicular to a channel plane and a tensile stress in a channel length direction, and forming, covering the p-channel transistor, a compressive stressor film which applies to a channel region of the p-channel transistor a tensile stress perpendicular to a channel plane and a compressive stress in a channel length direction.

6. The method of manufacturing a semiconductor device according to claim 5, further comprising, after removing the second insulating film of the first sidewall insulating film and before forming a tensile stressor film and a compressive stress or film, forming a third insulating film having a Young's modulus equal to or below the Young's modulus of silicon over the first device region and the second device region; and etching the third insulating film to thereby form a third sidewall insulating film of a layer structure of the first insulating film and the third insulating film on the side wall of the first gate electrode, and remove the third insulating film in the second device region to expose the second sidewall insulating film.

7. The method of manufacturing a semiconductor device according to claim 5, wherein the first insulating film is a silicon oxide film, and the second insulating film is a silicon nitride film.

8. The method of manufacturing a semiconductor device according to claim 6, wherein the third insulating film is a silicon oxynitride film.

* * * * *